United States Patent
Wloczysiak

(10) Patent No.: US 11,646,782 B2
(45) Date of Patent: May 9, 2023

(54) CARRIER AGGREGATION CIRCUIT HAVING MULTI-STAGE FILTER COMBINATION

(71) Applicant: SKYWORKS SOLUTIONS, INC., Woburn, MA (US)

(72) Inventor: Stephane Richard Marie Wloczysiak, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/872,570

(22) Filed: May 12, 2020

(65) Prior Publication Data

US 2020/0358516 A1    Nov. 12, 2020

Related U.S. Application Data

(60) Provisional application No. 62/846,687, filed on May 12, 2019.

(51) Int. Cl.
| | | |
|---|---|---|
| H04B 1/00 | (2006.01) | |
| H04B 1/40 | (2015.01) | |
| H03H 7/18 | (2006.01) | |
| H04B 7/08 | (2006.01) | |
| H04B 1/16 | (2006.01) | |

(52) U.S. Cl.
CPC ............. *H04B 7/0868* (2013.01); *H03H 7/18* (2013.01); *H04B 1/16* (2013.01)

(58) Field of Classification Search
CPC . H04B 1/38; H04B 1/40; H04B 1/005; H04B 1/0057; H04B 1/006; H04B 1/0067; H04B 1/16; H03H 7/18
See application file for complete search history.

(56) References Cited

U.S. PATENT DOCUMENTS

| | | | |
|---|---|---|---|
| 10,530,415 B2 * | 1/2020 | Ellä | H03H 7/463 |
| 2019/0181890 A1* | 6/2019 | Schmidhammer | H04B 1/006 |
| 2020/0343930 A1* | 10/2020 | DiTommaso | H04B 1/44 |

* cited by examiner

*Primary Examiner* — Blane J Jackson
(74) *Attorney, Agent, or Firm* — Chang & Hale LLP

(57) ABSTRACT

Carrier aggregation circuit having multi-stage filter combination. In some embodiments, a carrier aggregation circuit can include a first combining stage configured to aggregate a first signal in a first path associated with a first band and a second signal in a second path associated with a second band to provide a first aggregated signal in a first combined path. The carrier aggregation circuit can further include a second combining stage configured to aggregate the first aggregated signal in the first combined path and a third signal in a third path associated with a third band to provide a second aggregated signal in a second combined path.

15 Claims, 23 Drawing Sheets

# CARRIER AGGREGATION CIRCUIT HAVING MULTI-STAGE FILTER COMBINATION

CROSS-REFERENCE TO RELATED APPLICATION(S)

This application claims priority to U.S. Provisional Application No. 62/846,687 filed May 12, 2019, entitled CARRIER AGGREGATION CIRCUIT HAVING MULTI-STAGE FILTER COMBINATION, the disclosure of which is hereby expressly incorporated by reference herein in its respective entirety.

BACKGROUND

Field

The present disclosure relates to carrier aggregation circuits in radio-frequency (RF) applications.

Description of the Related Art

In radio-frequency (RF) applications, two or more signals in respective frequency bands can be combined together and processed together. Such a functionality, also referred to as carrier aggregation, can be utilized for downlink applications involving received signals, or for uplink applications for transmit signals.

SUMMARY

In accordance with a number of implementations, the present disclosure relates to a carrier aggregation circuit that includes a first combining stage configured to aggregate a first signal in a first path associated with a first band and a second signal in a second path associated with a second band to provide a first aggregated signal in a first combined path. The carrier aggregation circuit further includes a second combining stage configured to aggregate the first aggregated signal in the first combined path and a third signal in a third path associated with a third band to provide a second aggregated signal in a second combined path.

In some embodiments, the first path can be configured to receive the first signal from a first filter, the second path can be configured to receive the second signal from a second filter, and the third path can be configured to receive the third signal from a third filter. In some embodiments, each of the first and second paths of the first combining stage can include a phase shifting circuit. In some embodiments, each phase shifting circuit of the respective path can be tuned to include the band associated with the other path. In some embodiments, the third path can include a phase shifting circuit.

In some embodiments, the first combining stage can include a switch circuit configured to connect or disconnect each of the first and second paths to the first combined path. The first combined path can include a phase shifting circuit. The phase shifting circuit of the first combined path can be tuned to include the band associated with the third path. The phase shifting circuit of the first combined path can be part of the second combining stage.

In some embodiments, the second combining stage can include a switch circuit configured to connect or disconnect each of the first combined path and the third path to the second combined path. The switch circuit of the first combining stage and the switch circuit of the second combining stage can be configured to support a carrier aggregation operation or a non-carrier aggregation operation. The non-carrier aggregation operation can include a first band operation involving only the first signal, a second band operation involving only the second signal, or a third band operation involving only the third signal. The carrier aggregation operation can include a two-band operation involving two of the first, second and third signals. The carrier aggregation operation can include a three-band operation involving all of the first, second and third signals.

In some embodiments, the first path can be configured to provide the first signal to a first filter, and the second path can be configured to provide the second signal to a second filter, with the first and second filters being arranged in a ganged configuration having the first combined path as an output. In some embodiments, the first and second filters can be parts of the first combining stage. In some embodiments, the third path can be configured to receive the third signal from a third filter. In some embodiments, the third path can include a phase shifting circuit.

In some embodiments, the first combined path can include a phase shifting circuit. The phase shifting circuit of the first combined path can be tuned to include the band associated with the third path. The phase shifting circuit of the first combined path can be part of the second combining stage.

In some embodiments, the second combining stage can include a switch circuit configured to connect or disconnect each of the first combined path and the third path to the second combined path. The switch circuit of the second combining stage can be configured to support a carrier aggregation operation or a non-carrier aggregation operation. The non-carrier aggregation operation can include a single-band operation involving the third signal. The carrier aggregation operation can include a two-band operation involving the first and second signals. The carrier aggregation operation can include a three-band operation involving all of the first, second and third signals.

In some embodiments, the first band, the second band and the third band can include a combination of a mid low band, a mid band and a high band. As an example, the first band can include the mid low band, the second band can include the mid band, and the third band can include the high band.

In some embodiments, each of the first, second and third bands can include a cellular frequency band. In some embodiments, each of the first, second and third signals can be a received signal.

In some embodiments, the carrier aggregation circuit can further include a switchable bypass path implemented for at least one of the first, second and third paths. Each bypass path can be configured to support a non-carrier aggregation operation involving the respective band.

In some embodiments, the carrier aggregation circuit can further include a third combining stage configured to aggregate the second aggregated signal in the second combined path and a fourth signal in a fourth path associated with a fourth band to provide a third aggregated signal in a third combined path.

In some embodiments, at least one of the first signal, the second signal and the third signal can be further associated with another band in addition to the respective band.

In some embodiments, the carrier aggregation circuit can further include a control circuit configured to control operation of each of the first and second combining stages.

In some embodiments, at least one of the first path, the second path and the third path can be configured to receive its respective signal from a diversity receive antenna.

In some implementations, the present disclosure relates to a radio-frequency module that includes a packaging substrate configured to receive a plurality of components, and a carrier aggregation circuit implemented on the packaging substrate. The carrier aggregation circuit includes a first combining stage configured to aggregate a first signal in a first path associated with a first band and a second signal in a second path associated with a second band to provide a first aggregated signal in a first combined path. The carrier aggregation circuit further includes a second combining stage configured to aggregate the first aggregated signal in the first combined path and a third signal in a third path associated with a third band to provide a second aggregated signal in a second combined path.

In some embodiments, each of the first, second and third signals can be a received signal. In some embodiments, the radio-frequency module can be a front-end module. In some embodiments, the radio-frequency module can be a diversity receive module.

According to some implementations, the present disclosure relates to a radio-frequency device that includes an antenna and a front-end architecture in communication with the antenna and having a carrier aggregation circuit. The carrier aggregation circuit includes a first combining stage configured to aggregate a first signal in a first path associated with a first band and a second signal in a second path associated with a second band to provide a first aggregated signal in a first combined path. The carrier aggregation circuit further includes a second combining stage configured to aggregate the first aggregated signal in the first combined path and a third signal in a third path associated with a third band to provide a second aggregated signal in a second combined path.

In some embodiments, the radio-frequency device can be a wireless device. In some embodiments, the wireless device can be a cellular phone.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Cellular carrier aggregation (CA) can be supported by allowing two or more radio-frequency (RF) signals to be processed through a common path. For example, carrier aggregation can involve use of a path for a plurality of bands having frequency ranges that are sufficiently separated. In such a configuration, simultaneous operation involving more than one band is possible.

In the context of a receiver, carrier aggregation can allow concurrent processing of RF signals in a plurality of bands to provide, for example, high data rate capability. In such a carrier aggregation system, it is desirable to maintain a low noise figure (NF) for each RF signal. When two bands being aggregated are close in frequency, maintaining sufficient separation of the two bands is also desirable.

In some RF applications such cellular LTE application, it is desirable to have a front end be able to process signals from different frequency bands simultaneously. Such a capability can be challenging in some situations. For example, carrier aggregation involving mid low band (MLB) frequency (e.g., B11/21, B32), mid band (MB) frequency (e.g., B1, B3) and high band (HB) frequency (e.g., B7) can be difficult for at least one of the bands.

Figure 1:
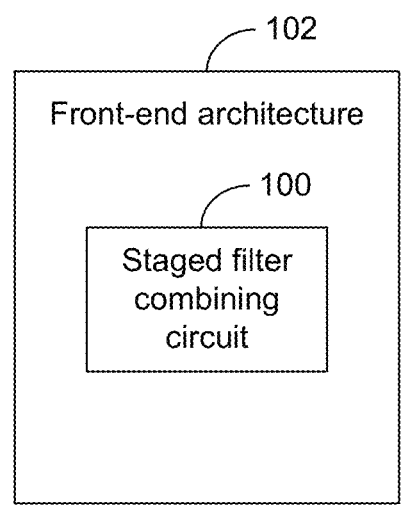
FIG. 1 shows a front-end architecture having a staged filter combining circuit that can support carrier aggregation (CA) operations.

FIG. 1 shows a front-end architecture 102 having a staged filter combining circuit 100 that can support carrier aggregation (CA) operations. In some embodiments, such a staged filter combining circuit 100 can address some or all of the foregoing design concerns related to carrier aggregation. Examples of the staged filter combining circuit 100 are described herein in greater detail.

Figure 2:
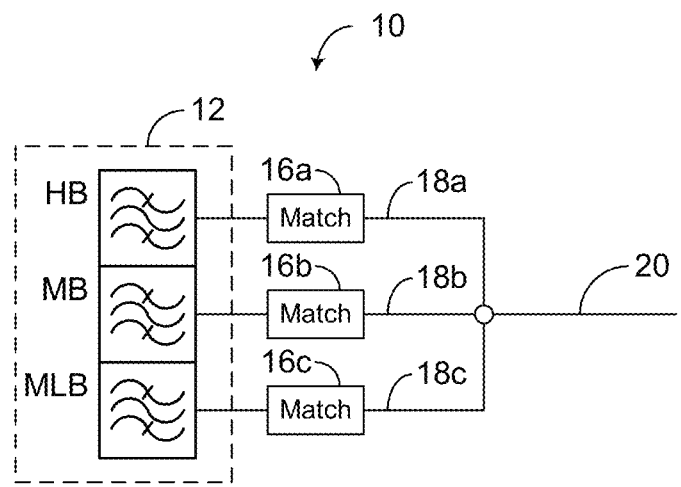
FIG. 2 shows an example of a carrier aggregation configuration in which multiple bands are combined in a single stage.

FIG. 2 shows an example of a carrier aggregation configuration 10 in which multiple bands are combined in a single stage. More particularly, a HB signal path 18a having a HB filter and a corresponding matching circuit 16a, an MB signal path 18b having an MB filter and a corresponding matching circuit 16b, and an MLB signal path 18c having an MLB filter and a corresponding matching circuit 16c are shown to be combined into a single path 20 in a single stage. In the example of FIG. 2, the HB, MB and MLB filters can be implemented in a ganged assembly 12.

Figure 3:
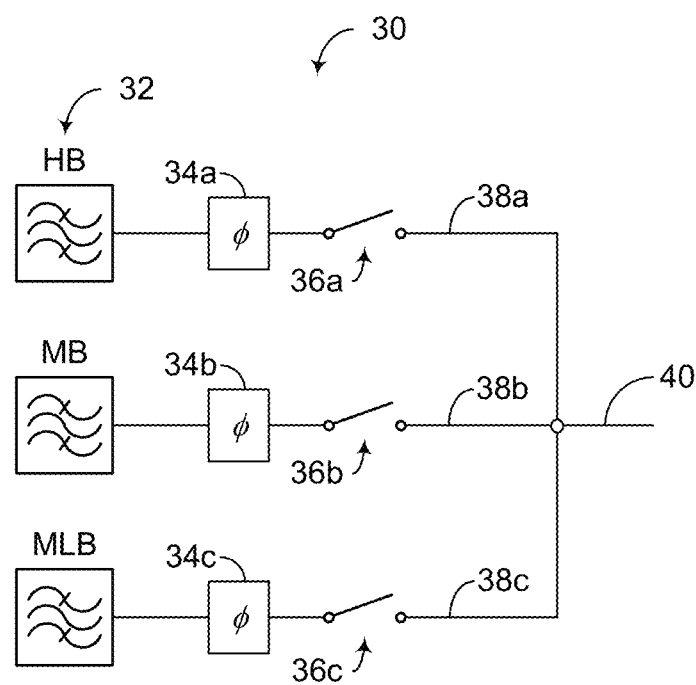
FIG. 3 shows an example of a carrier aggregation configuration in which multiple bands are combined in a single stage.

FIG. 3 shows another example of a carrier aggregation configuration 30 in which multiple bands are combined in a single stage. More particularly, a switchable HB signal path 38a (through a switch 36a) having a HB filter and a corresponding phase shifting circuit 34a, a switchable MB signal path 38b (through a switch 36b) having an MB filter and a corresponding phase shifting circuit 34b, and a switchable MLB signal path 38c (through a switch 36c) having an MLB filter and a corresponding phase shifting circuit 34c are shown to be combined into a single path 40 in a single stage. In the example of FIG. 3, the HB, MB and MLB paths can be switched on and off in different combinations to allow carrier aggregation operations, as well as non-carrier aggregation operations.

Figure 4:
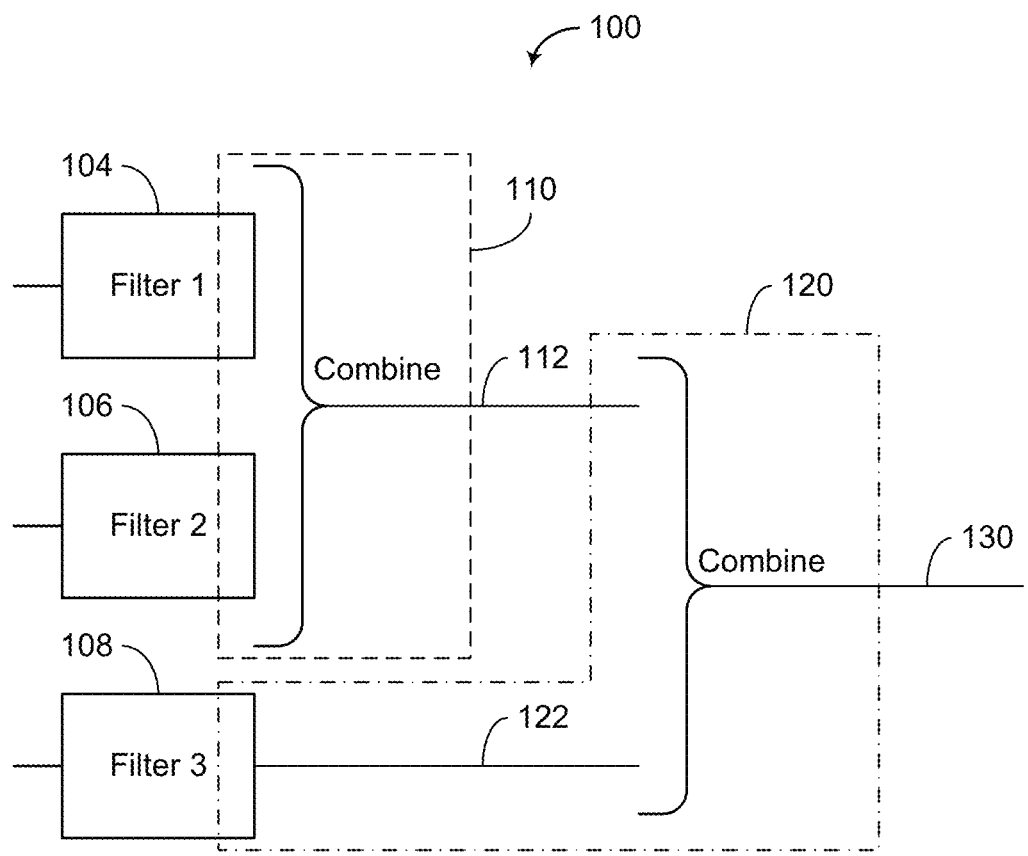
FIG. 4 shows that in some embodiments, a staged combining circuit can include a plurality of combining stages.

FIG. 4 shows that in some embodiments, a staged combining circuit 100 can include a plurality of combining stages. For example, a first combining stage 110 can combine signals associated with a plurality of filters (e.g., first and second filters 104, 106) into a first combined signal path 112. Such a first combined signal path can then be combined with another signal path 122 in a second combining stage 120 into a second combined signal path 130.

In the example of FIG. 4, the other signal path 122 is shown to be associated with a third filter 108. However, it will be understood that such a signal path (122) may be an uncombined signal path (as depicted in FIG. 4) or another combined signal path (e.g., resulting from combining of signals associated with a plurality of filters).

FIG. 4 shows that in some embodiments, the first combining stage 110 may involve the corresponding filters 104, 106, may not involve the corresponding filters 104, 106, or any combination thereof. Similarly, the second combining stage 120 may involve the corresponding filter 108, may not involve the corresponding filter 108, or any combination thereof.

In the example of FIG. 4, three bands associated with the three filters 104, 106, 108 are shown to be combined into the single signal path 130 in two combining stages. It will be understood that a staged combining circuit (100) having one or more features as described herein can include more than two combining stages. It will also be understood that a staged combining circuit (100) having one or more features as described herein can involve different numbers of bands for each of some or all of the combining stages.

For the purpose of description herein, it will be understood that terms such as "multi-stage," "multiple-stage," and the like can include configurations having a plurality of combining stages. For example, a multi-stage combining configuration can include a two-stage combining configuration, a three-stage combining configuration, or a combining configuration having higher number of stages.

For the purpose of description, specific cellular bands (e.g., B1, B3, etc.) and/or specific groups of bands (e.g., MLB, MB, HB) are utilized as examples. It will be understood that one or more features of the present disclosure are not necessarily limited to such cellular bands and/or band groups due to such examples, and may be implemented in situations involving other types of frequency bands and/or other groups of bands.

Some of the examples provided herein are described in the context of receive configurations. However, it will be understood that one or more features of the present disclosure can also be implemented in other configurations, including transmit configurations.

Figure 5:
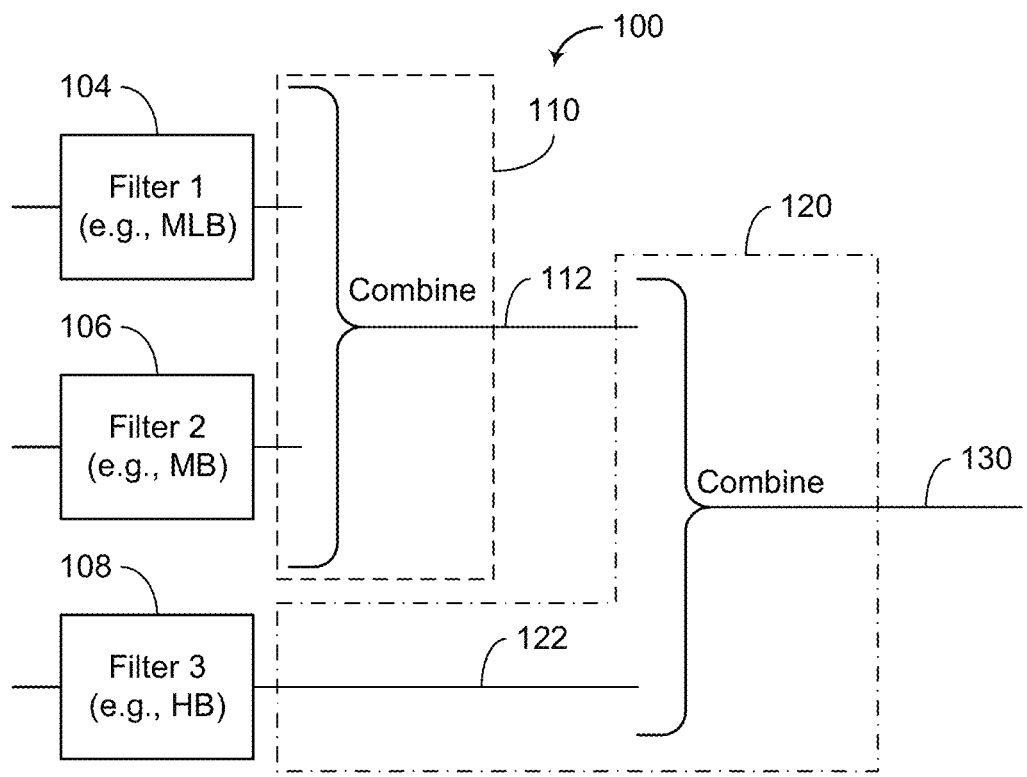
FIG. 5 shows a staged combining circuit in which combining stages do not involve respective filters.

As described in reference to FIG. 4, a combining stage may or may not involve filters. For example, FIG. 5 shows a staged combining circuit 100 in which combining stages do not involve respective filters. More particularly, FIG. 5 is similar to FIG. 4, except that each of the first and second combining stages 110, 120 does not involve corresponding filter(s). It will be understood that in some embodiments, some or all of the filters in the example of FIG. 5 may or may not be modified to accommodate the staged combining circuit 100, even though such filters are depicted as being outside of the respective combining stages for the purpose of description.

Figure 6:
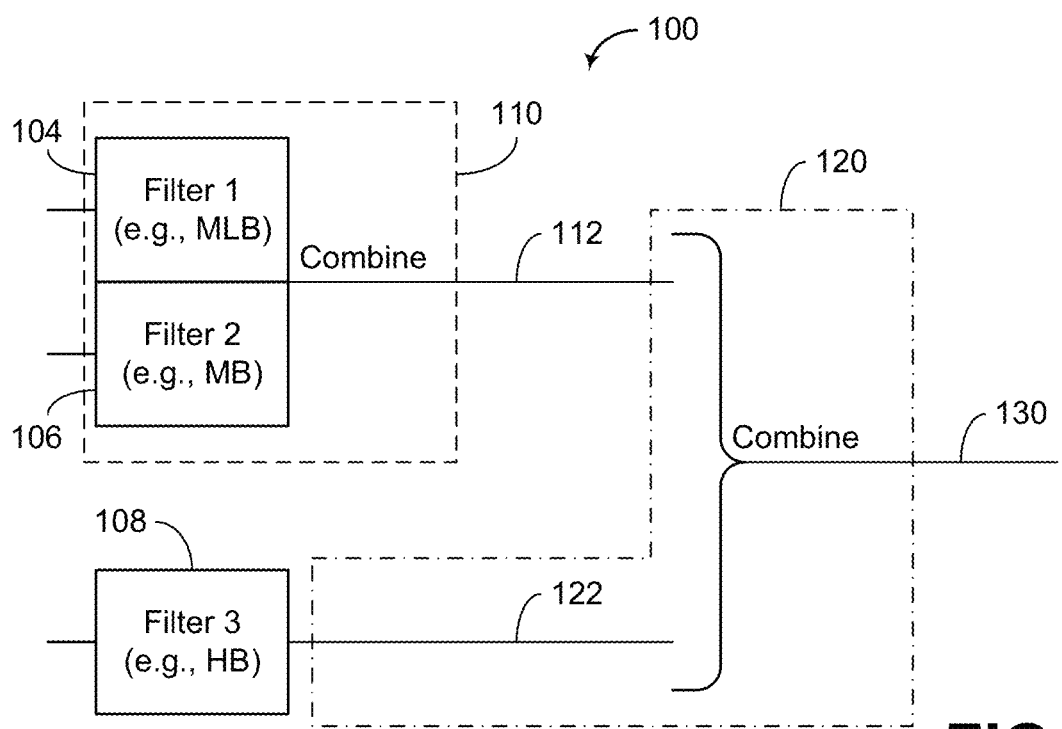
FIG. 6 shows a staged combining circuit in which at least some of combining stages involves respective filters.

In another example, FIG. 6 shows a staged combining circuit 100 in which at least some of combining stages involves respective filters. More particularly, FIG. 6 is similar to FIG. 4, except that the first combining stage 110 involves corresponding filters. It will be understood that in some embodiments, some or all of the filters in the example of FIG. 6 may or may not be modified to accommodate the staged combining circuit 100, even though such filters are depicted as being parts of the respective combining stage for the purpose of description.

It will be understood that in some embodiments, a staged combining circuit having one or more features as described herein can be configured such that no filter is involved in any of a plurality of combining stages, at least one combining stage does not involve any filter while another combining stage involves a plurality of filters, each of a plurality of combining stages involves a plurality of filters, or any combination thereof.

Figure 7:
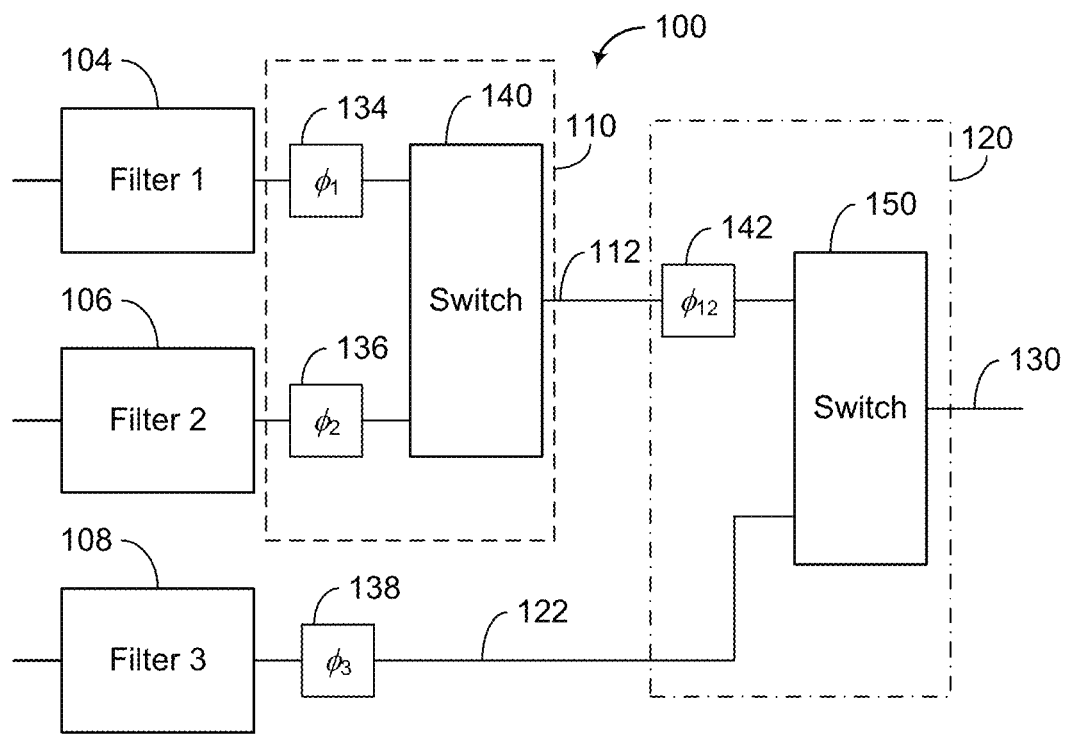
FIG. 7 shows a staged combining circuit that can be a more specific example of the staged combining circuit of FIG. 5.
Figure 8:
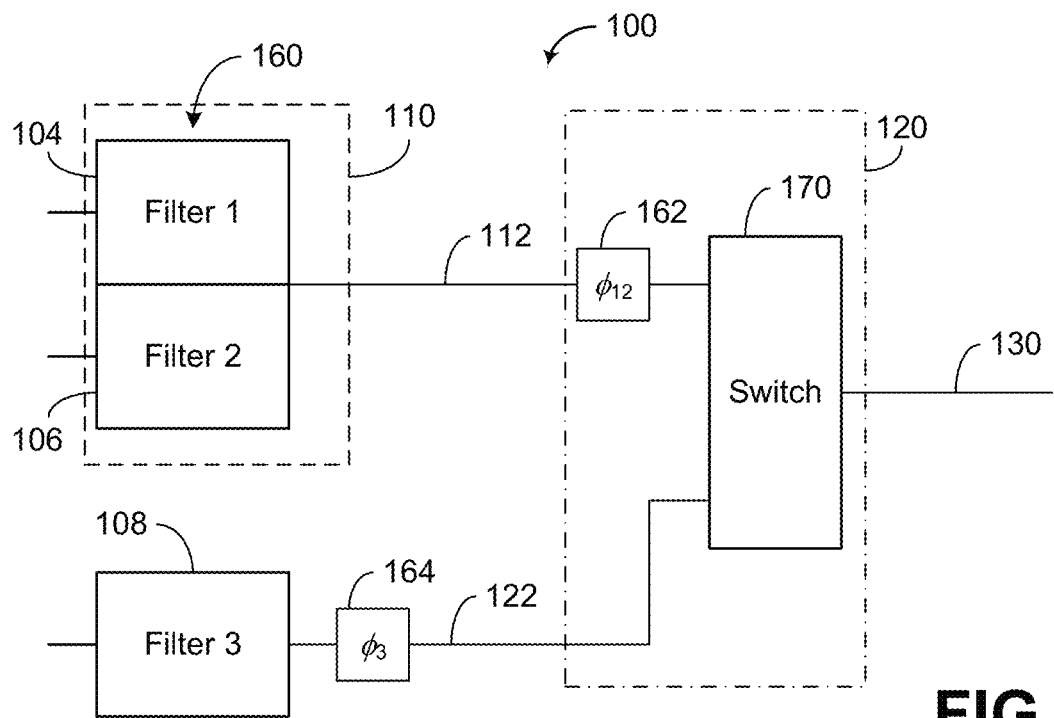
FIG. 8 shows a staged combining circuit that can be a more specific example of the staged combining circuit of FIG. 6.

FIG. 7 shows a staged combining circuit 100 that can be a more specific example of the staged combining circuit 100 of FIG. 5, and FIG. 8 shows a staged combining circuit 100 that can be a more specific example of the staged combining circuit 100 of FIG. 6.

FIG. 7 shows that in some embodiments, a staged combining circuit 100 can include one or more phase shifting circuits and one or more switch circuits. More particularly, and in the example context of FIG. 5, a first combining stage 110 is shown to include a first phase shifting circuit 134 implemented between a first filter 104 and a switch circuit 140, and a second phase shifting circuit 136 implemented between a second filter 104 and the switch circuit 140. In some embodiments, the switch circuit 140 can be configured to allow combining of the signal paths associated with the first and second filters 104, 106 into a first combined path 112. Such a switching configuration can support, for example, aggregation of the bands associated with the first and second filters 104, 106 into the first combined path 112.

In some embodiments, and as described herein, the switch circuit 140 can also be configured to allow non-carrier aggregation operations. For example, the switch circuit 140 can be operated to route a signal from the first filter 104 to the path 112, but not allow routing of a signal from the second filter 106 to the path 112, in a non-carrier aggregation operation involving a band associated with the first filter 104.

In the example of FIG. 7, a second combining stage 120 is shown to include a phase shifting circuit 142 implemented along the first combined path 112, between the switch circuit 140 and a switch circuit 150. In some embodiments, the switch circuit 150 can be configured to allow combining of signal paths associated with the phase shifting circuit 142 (path 112) and a third filter 108 (path 122) into a second combined path 130. Such a switching configuration can support, for example, aggregation of already aggregated bands (associated with the first and second filters 104, 106) with a band associated with the third filter 108, into the second combined path 130. If a signal in the path 112 is in a non-aggregated band (associated with the first filter 104 or the second filter 106), the switch circuit 150 can support aggregation of such a non-aggregated band with a band associated with the third filter 108, into the second combined path 130.

In some embodiments, and as described herein, the switch circuit 150 can also be configured to allow non-carrier aggregation operations. For example, and assuming that a non-carrier aggregation operation involves a signal associated with the first filter 104, the switch circuit 150 can be operated to route a signal from the path 112 to the path 130, but not allow routing of a signal from the third filter 108 to the path 130. In another example, if a non-carrier aggregation operation involves a signal associated with the third filter 108, the switch circuit 150 can be operated to route a signal from the path 122 to the path 130, but not allow routing of a signal through the path 112 to the path 130.

In the example of FIG. 7, the signal path 122 is shown to include a phase shifting circuit 138 implemented between the third filter 108 and the switch circuit 150. In some embodiments, such a phase shifting circuit (138) may or may not be present.

Similarly, in the example of FIG. 7, each of the first and second filters 104, 106 is shown to have associated with it a phase shifting circuit (134 or 136). In some embodiments, a phase shifting circuit can be provided for one filter, but not for the other filter.

FIG. 8 shows that in some embodiments, a staged combining circuit 100 can include an assembly of two or more ganged filters, one or more phase shifting circuits, and one or more switch circuits. More particularly, and in the example context of FIG. 6, a first combining stage 110 is shown to include a ganged assembly 160 of first and second filters 104, 106. In some embodiments, such a ganged configuration can allow respective signals associated with the first and second filters 104, 106 to be aggregated together into a first combined path 112 with a desirable set of one or more performance features. Such a ganged configuration can support, for example, carrier aggregation of the bands associated with the first and second filters 104, 106 into the first combined path 112.

In the example of FIG. 8, a second combining stage 120 is shown to include a phase shifting circuit 162 implemented along the first combined path 112, between the ganged-filter assembly 160 and a switch circuit 170. In some embodiments, the switch circuit 170 can be configured to allow combining of signal paths associated with the phase shifting circuit 162 (path 112) and a third filter 108 (path 122) into a second combined path 130. Such a switching configuration can support, for example, aggregation of already aggregated bands (associated with the first and second filters 104, 106) with a band associated with the third filter 108, into the second combined path 130.

In some embodiments, and as described herein, the switch circuit 170 can also be configured to allow at least some non-carrier aggregation operation. For example, the switch circuit 170 can be operated to route a signal from the path 122 (associated with the third filter 108) to the path 130, but not allow routing of a signal from the path 112 to the path 130.

In the example of FIG. 8, the signal path 122 is shown to include a phase shifting circuit 164 implemented between the third filter 108 and the switch circuit 170. In some embodiments, such a phase shifting circuit (164) may or may not be present.

In some embodiments, a phase shifting circuit along a signal path can be tuned to include one or more bands that can be carrier aggregated with one or more bands associated with the signal path. For example, in the context of FIG. 7, suppose that the first filter 104 is configured to support a first frequency band, the second filter 106 is configured to support a second frequency band, and the third filter 108 is configured to support a third frequency band.

Accordingly, in the example of FIG. 7, the phase shifting circuit 134 associated with the first filter 134 can be tuned to include the second frequency band associated with the second filter 106, since the first and second bands can be carrier aggregated by the first combining stage 110. Likewise, the phase shifting circuit 136 associated with the second filter 106 can be tuned to include the first frequency band associated with the first filter 104, since the first and second bands can be carrier aggregated by the first combining stage 110. Similarly, the phase shifting circuit 142 associated with the signal path 112 can be tuned to include the third frequency band associated with the third filter 108, since either or both of the first and second bands associated with the signal path 112 can be carrier aggregated with the third band by the second combining stage 120. Likewise, the phase shifting circuit 138 associated with the third filter 108 can be tuned to include the first and second frequency bands associated with the signal path 112, since the third band can be carrier aggregated with either or both of the first and second bands associated with the signal path 112.

Similarly, in the example of FIG. 8, the phase shifting circuit 162 associated with the signal path 112 can be tuned to include the third frequency band associated with the third filter 108, since either or both of the first and second bands associated with the signal path 112 can be carrier aggregated with the third band by the second combining stage 120. Likewise, the phase shifting circuit 164 associated with the third filter 108 can be tuned to include the first and second frequency bands associated with the signal path 112, since the third band can be carrier aggregated with either or both of the first and second bands associated with the signal path 112.

Figure 9:
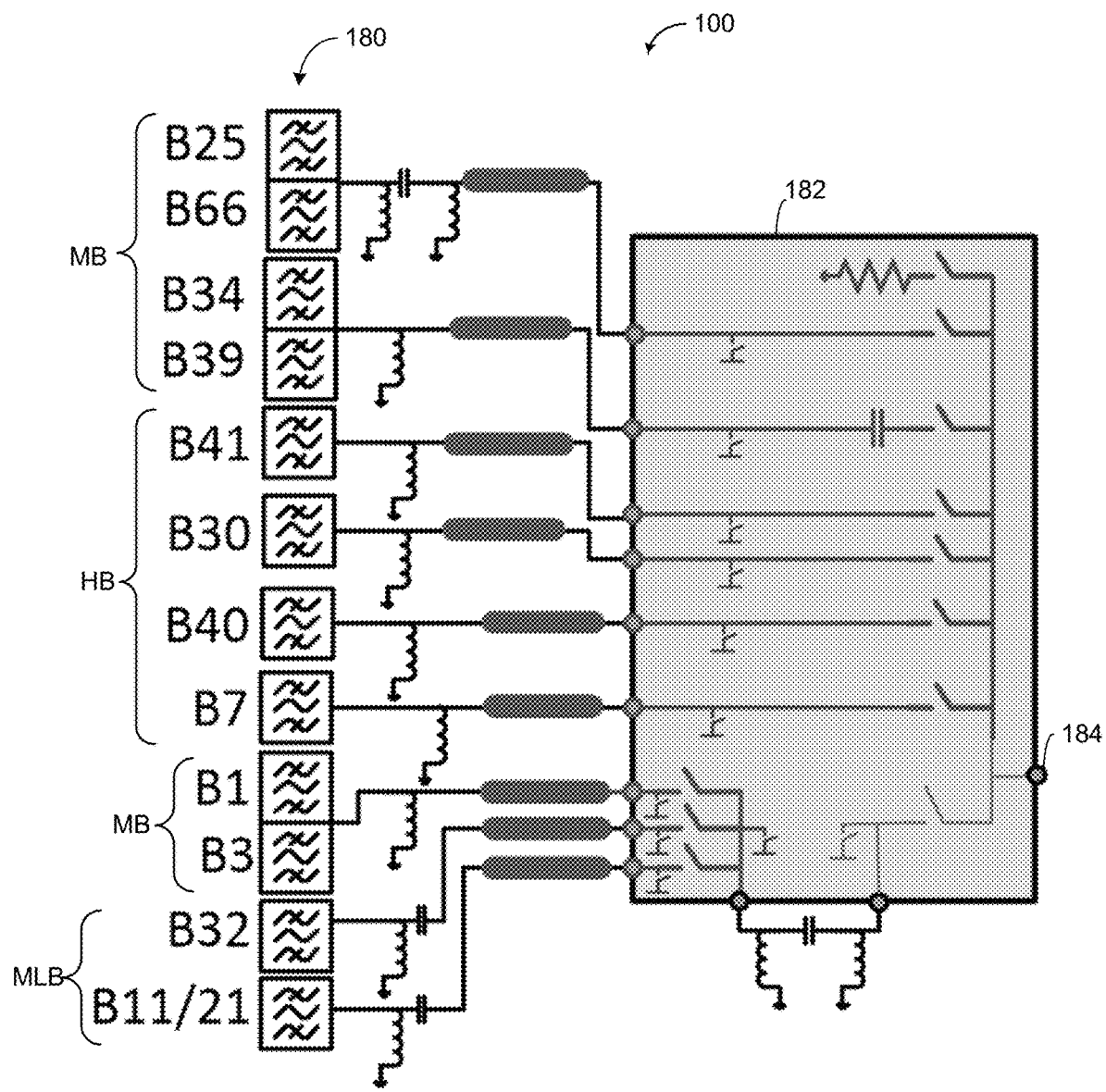
FIG. 9 shows an example front-end architecture with a staged combining circuit having one or more features as described herein.

FIG. 9 shows an example front-end architecture with a staged combining circuit 100 having one or more features as described herein. Such a front-end architecture can include a number of filters (collectively indicated as 180) implemented in one or more different forms, a number of signal paths having phase shifting circuits, and a switch network 182 that can support various carrier aggregation and non-carrier aggregation operations.

In the example of FIG. 9, the switch network 182 is shown to provide an output node 184. In some embodiments, such an output node can be connected to a combined path (130 in FIGS. 7 and 8) resulting from the second combining stage (120).

In the example of FIG. 9, various cellular frequency bands are indicated for the filters 180, and such bands are either mid low band (MLB), mid band (MB) or high band (HB). It will be understood that a front-end having one or more features as described herein can have different combinations of bands, additional bands, less bands, or any combination thereof. It will also be understood that a front-end having one or more features as described herein can have different combinations of band-types than the shown MLB-MB-HB combination.

Figure 10:
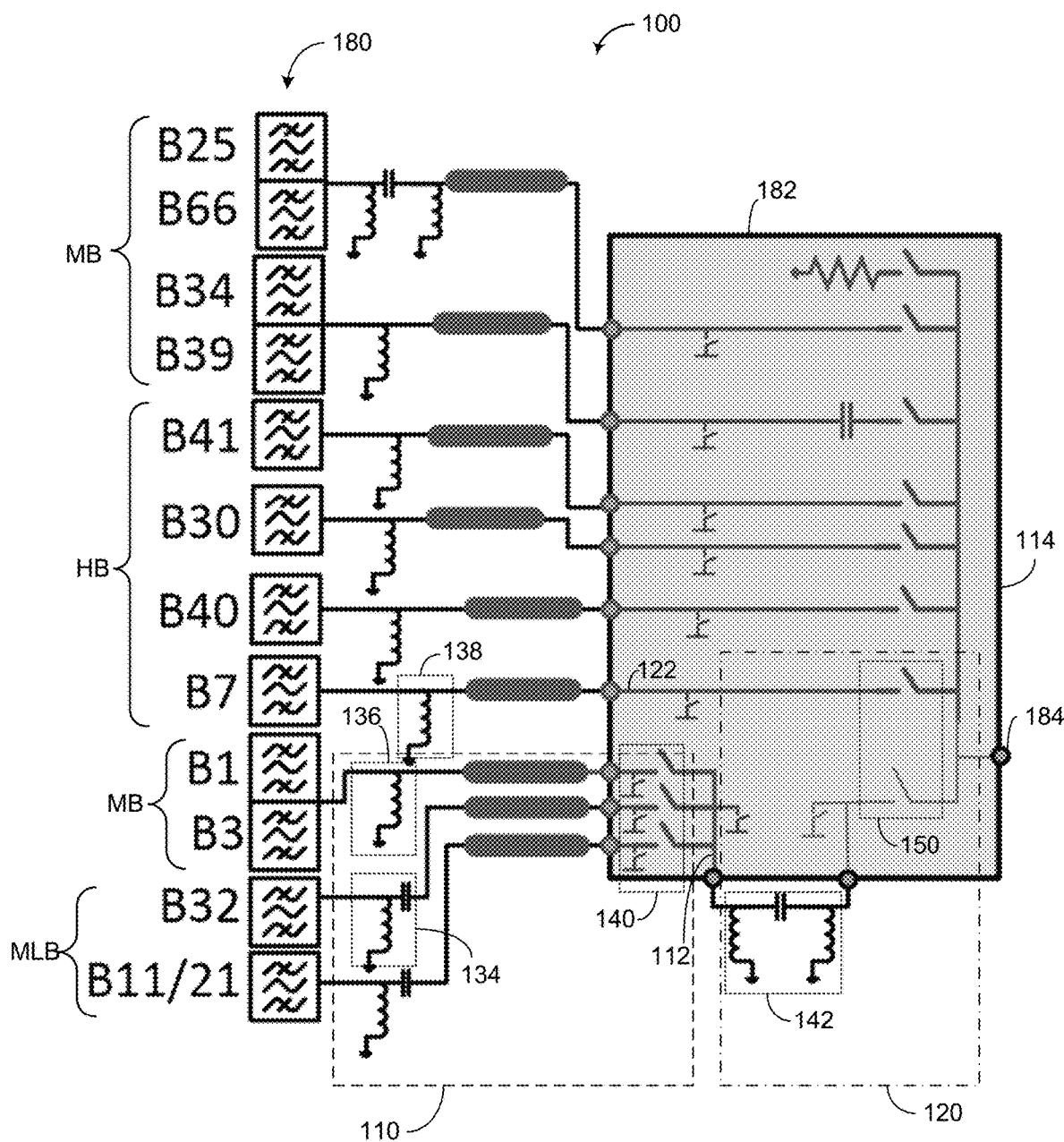
FIG. 10 shows the same front-end architecture as the example of FIG. 9, but with examples of parts in the context of the staged combining circuit of FIG. 7.

FIG. 10 shows the same front-end architecture as the example of FIG. 9, but with examples of parts in the context of the staged combining circuit 100 of FIG. 7. More particularly, band B32 is being used as an example of an MLB, band(s) B1/B3 is being used as an example an MB, and B7 is being used as an example of an HB. It will be understood that other examples based on FIG. 7 can also be identified. For example, B41 can be used as an example of an HB.

In the context of the foregoing example bands identified in FIG. 10, phase shifting circuits 134, 136, 138 associated with the MLB, MB and HB filters (B32, B1/B3, B7) are indicated. More particularly, the phase shifting circuit 134 is shown to include a capacitance along a signal path from the B32 filter, and an inductance between ground and a node between the B32 filter and the capacitance. The phase shifting circuit 136 is shown to include a capacitance along a signal path from the B1/B3 filter-assembly. The phase shifting circuit 138 is shown to include a capacitance along a signal path from the B7 filter.

Referring to FIG. 10, a first combining stage 110 that includes the phase shifting circuits 134, 136, as well as a switch circuit 140, is also indicated. A combined signal path 112 resulting from such a first combining stage is also indicated. The switch 140 is shown to include a switch between the signal path with the phase shifting circuit 134 and the combined signal path 112, and a switch between the signal path with the phase shifting circuit 136 and the combined signal path 112.

Similarly, a second combining stage 120 and corresponding phase shifting circuit 142 and switch circuit 150 are indicated. A combined signal path (130 in FIG. 7) resulting from such a second combining stage is shown to provide an output node 184. More particularly, the phase shifting circuit 142 is shown to include a capacitance along the signal path 112 from the first combining stage 110, and an inductance that couples each side of the capacitance to ground. The switch 150 is shown to include a switch between a signal path 122 with the phase shifting circuit 138 and the combined output node 184, and a switch between the signal path 112 with the phase shifting circuit 142 and the combined output node 138.

Figure 11:
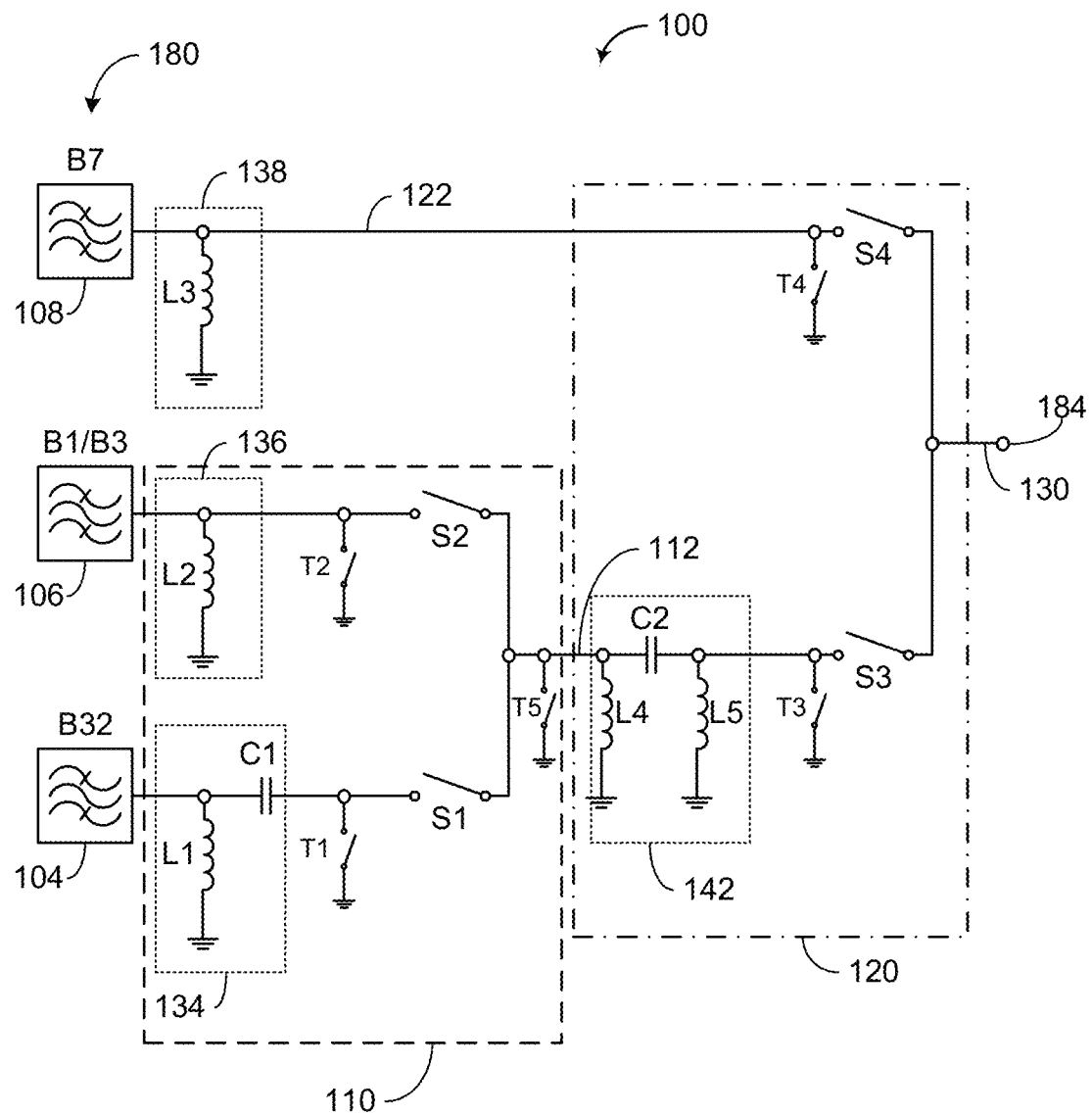
FIG. 11 shows an isolated view of the example front-end of FIG. 10, with only the selected example parts indicated in FIG. 10.

FIG. 11 shows an isolated view of the example front-end of FIG. 10, with only the selected example parts indicated in FIG. 10. In FIG. 11, the phase shifting circuit 134 associated with the B2 filter 104 is shown to include a series capacitance C1 and an inductance L1 that couples the input side of C1 to ground. The phase shifting circuit 136 associated with the B1/B3 filter 106 is shown to include an inductance L2 that couples the output of the filter 106 to ground. The phase shifting circuit 138 associated with the B7 filter 108 is shown to include an inductance L3 that couples the output of the filter 108 to ground. The phase shifting circuit associated with the combined signal path 112 is shown to include a series capacitance C2, an inductance L4 that couples the input side of C2 to ground, and an inductance L5 that couples the output side of C2 to ground. As described herein, values of such inductances and capacitances can be selected to provide desired support for respective carrier aggregation operations.

In the example of FIG. 11, the switch between the B32 filter 104 and the combined signal path 112 is indicated as S1, and the switch between the B1/B3 filter 106 and the combined signal path 112 is indicated as S2. The filter side of the switch S1 is shown to be switchably coupled to ground through a shunt switch T1, and the other side of the switch S1 is shown to be switchably coupled to ground through a shunt switch T5. Similarly, the filter side of the switch S2 is shown to be switchably coupled to ground through a shunt switch T2, and the other side of the switch S2 is shown to be switchably coupled to ground through the shunt switch T5.

Referring to FIG. 11, the switch between the B7 filter 108 and the combined signal path 130 is indicated as S4, and the switch between the combined signal path 112 and the combined signal path 130 is indicated as S3. The filter side of the switch S4 is shown to be switchably coupled to ground through a shunt switch T4. Similarly, the filter side of the switch S3 is shown to be switchably coupled to ground through a shunt switch T3. In some embodiments, the signal path (130) side of the switches S4 and S3 may or may not include a shunt switch for switchable coupling to ground.

Figure 12A:
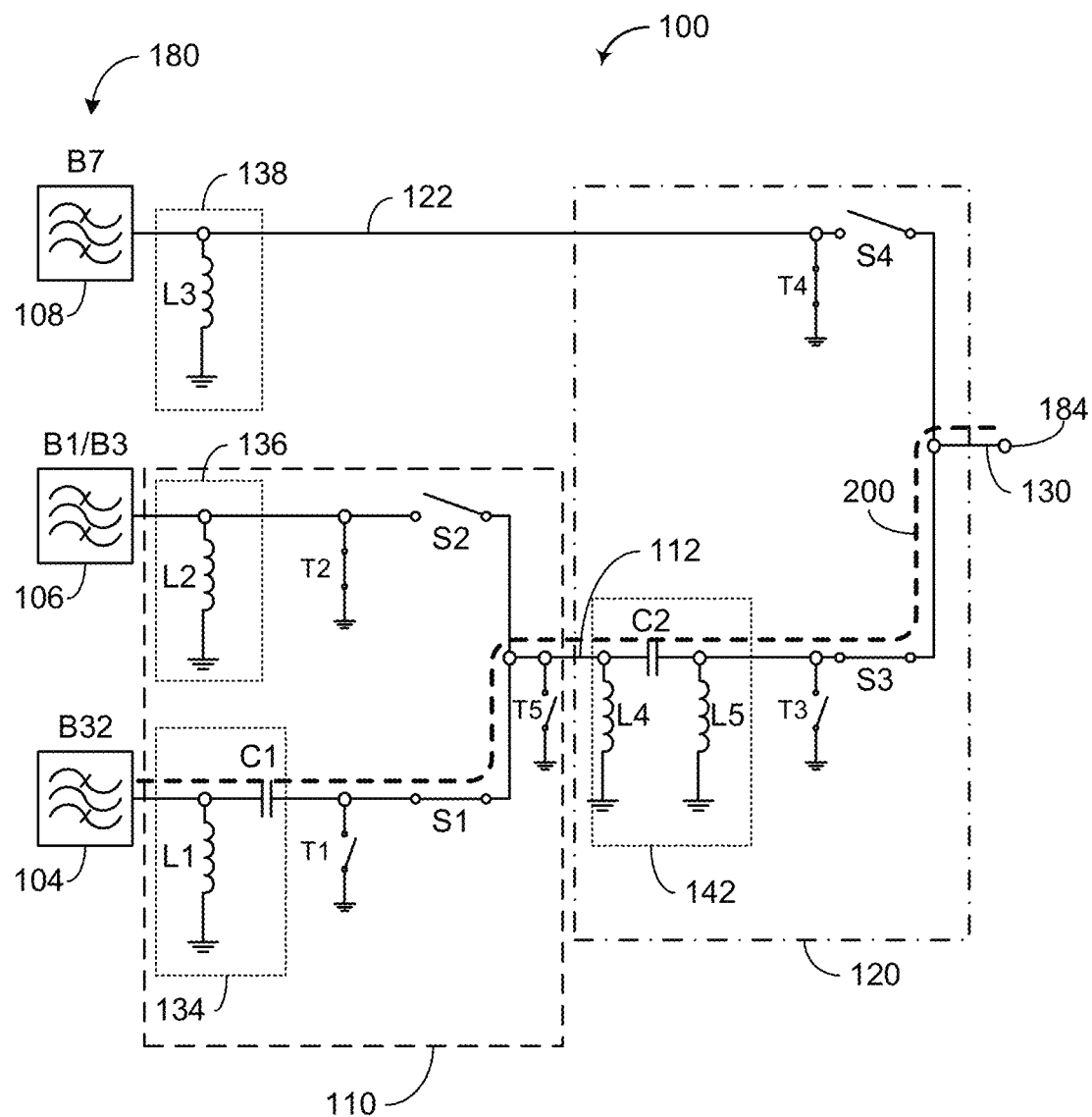
FIG. 12A shows an example of a non-carrier aggregation operation involving an example MLB band B32.
Figure 12B:
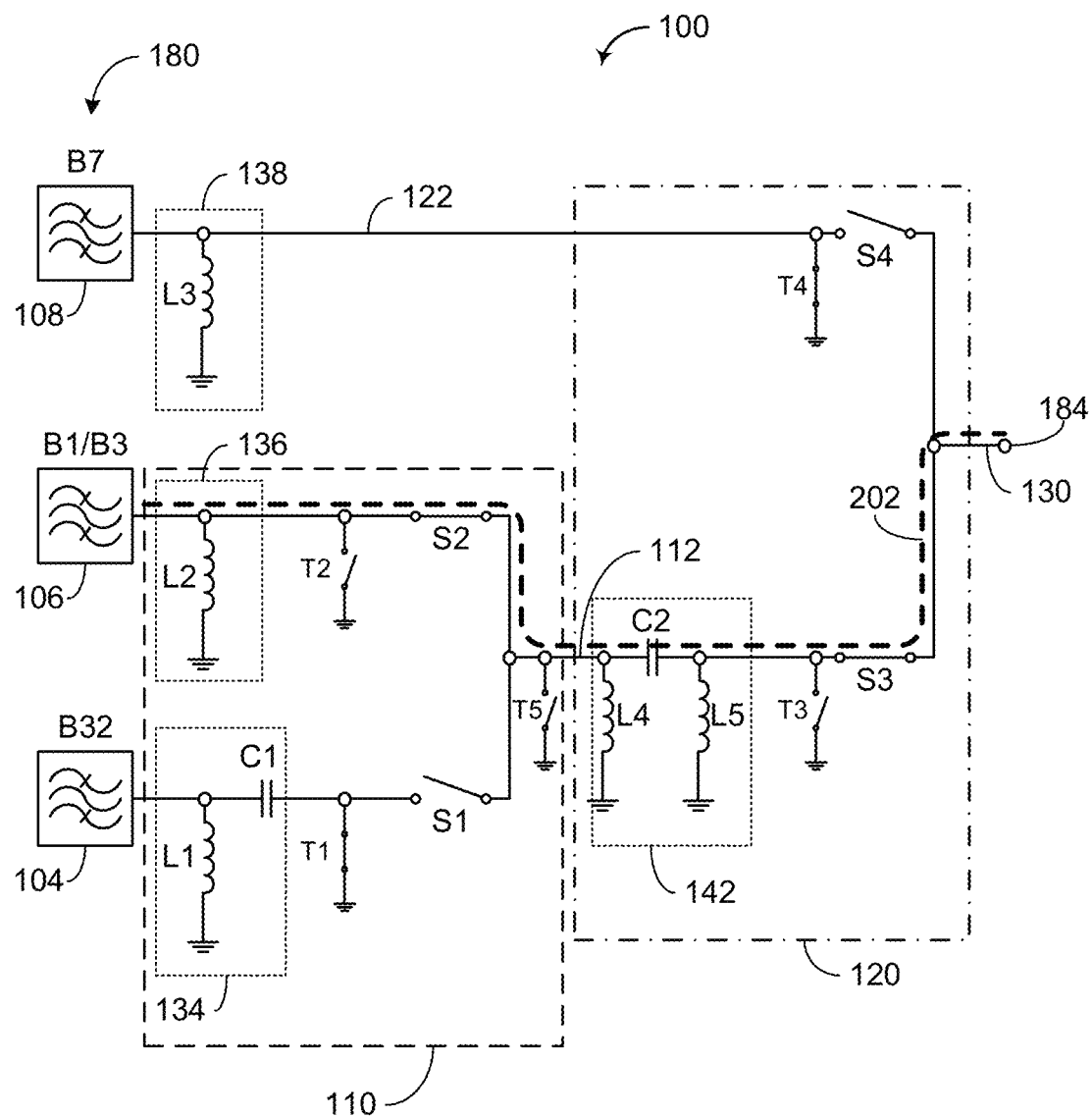
FIG. 12B shows an example of a non-carrier aggregation operation involving an example MB band B1/B3.
Figure 12C:
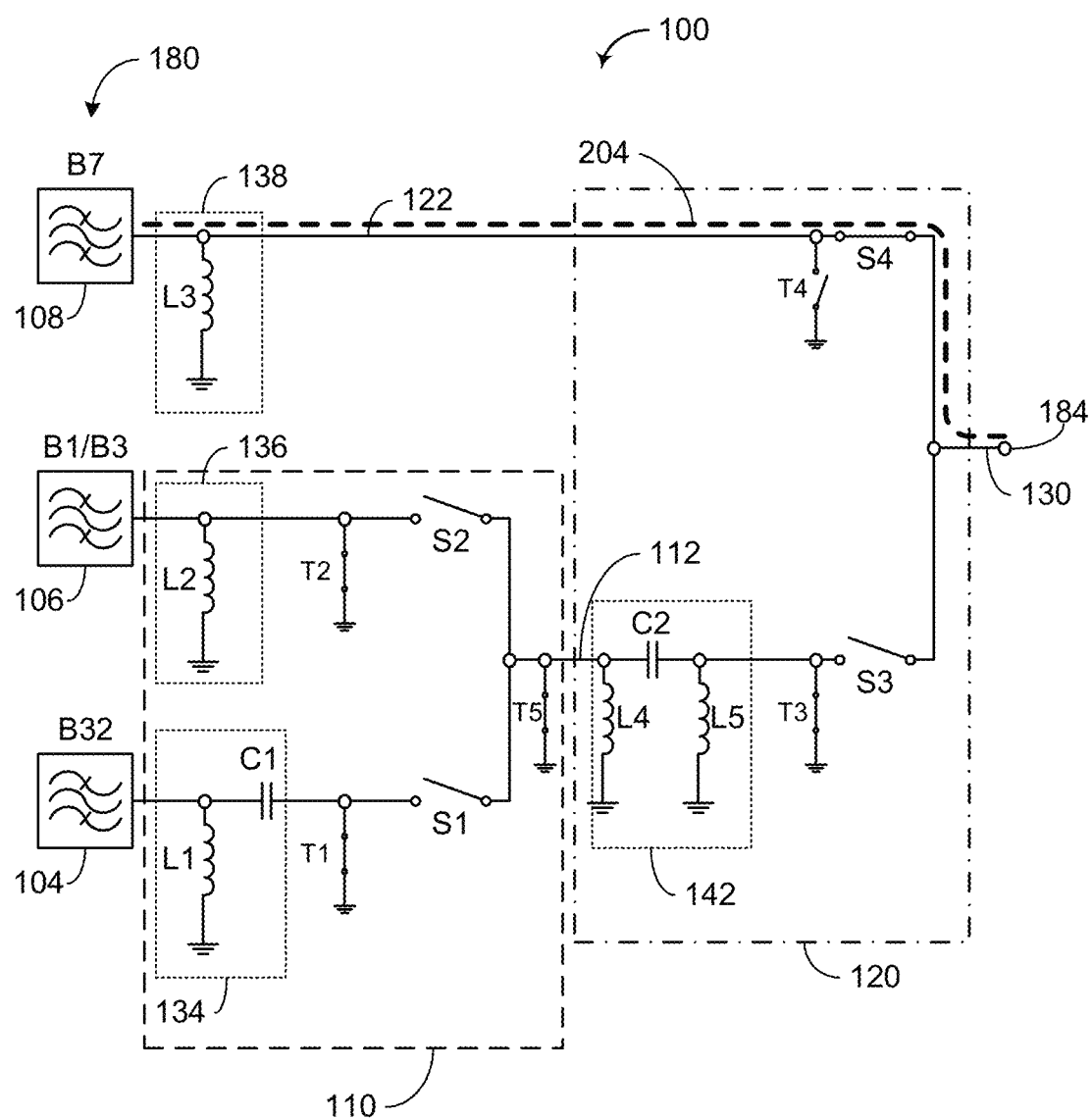
FIG. 12C shows an example of a non-carrier aggregation operation involving an example HB band B7.
Figure 12D:
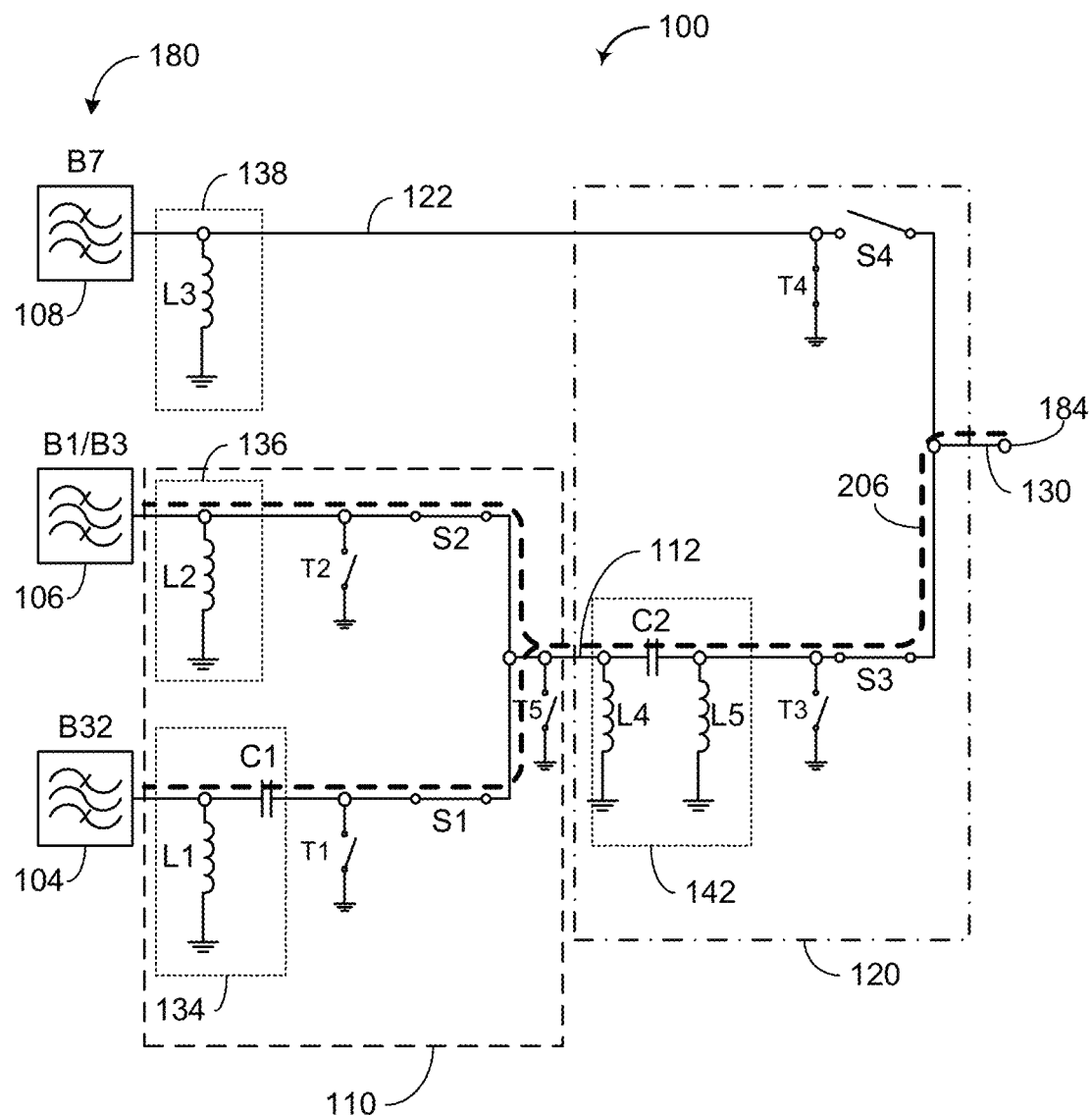
FIG. 12D shows an example of a two-band carrier aggregation operation involving the B32 band and the B1/B3 band.
Figure 12E:
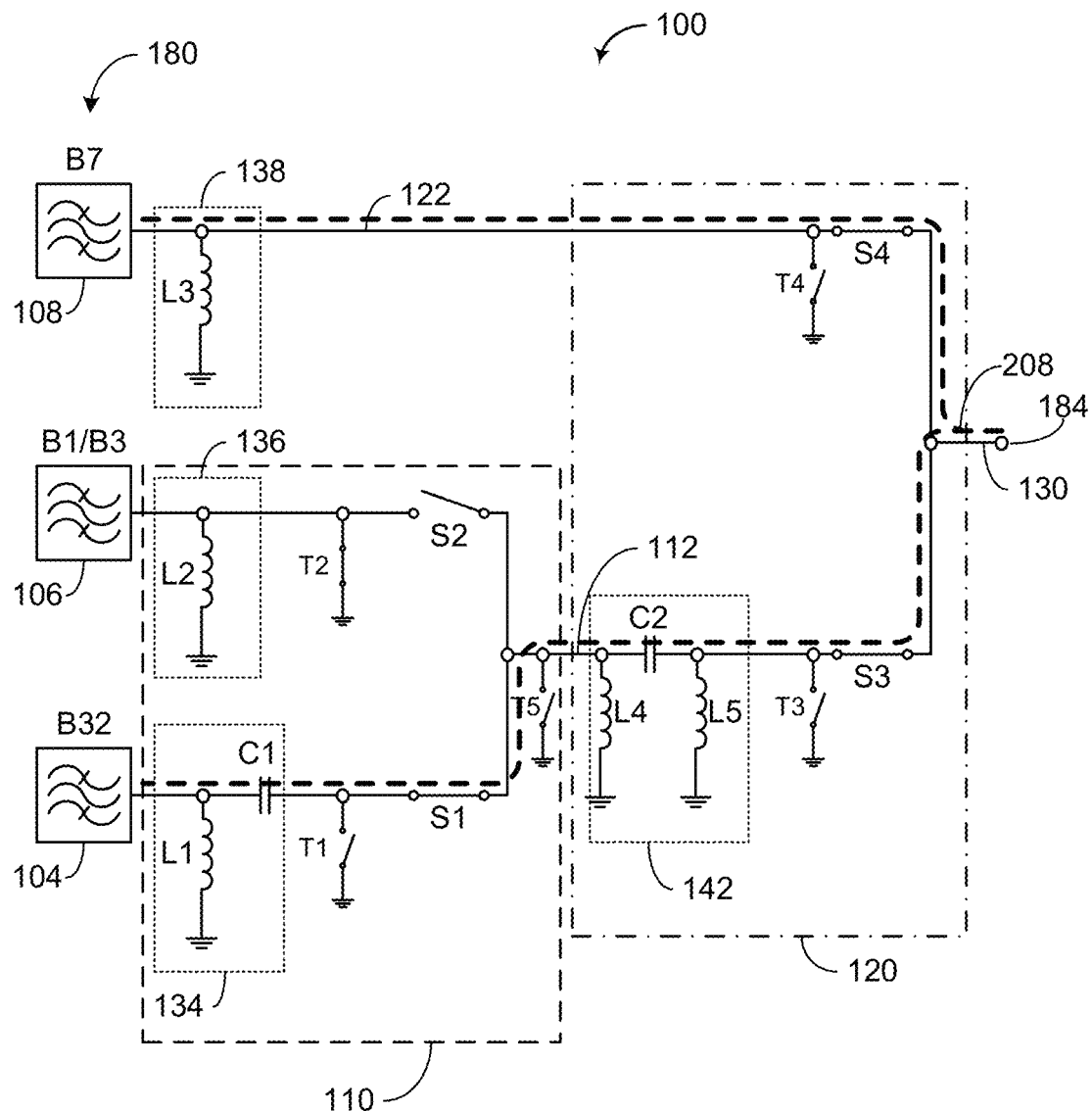
FIG. 12E shows an example of a two-band carrier aggregation operation involving the B32 band and the B7 band.
Figure 12F:
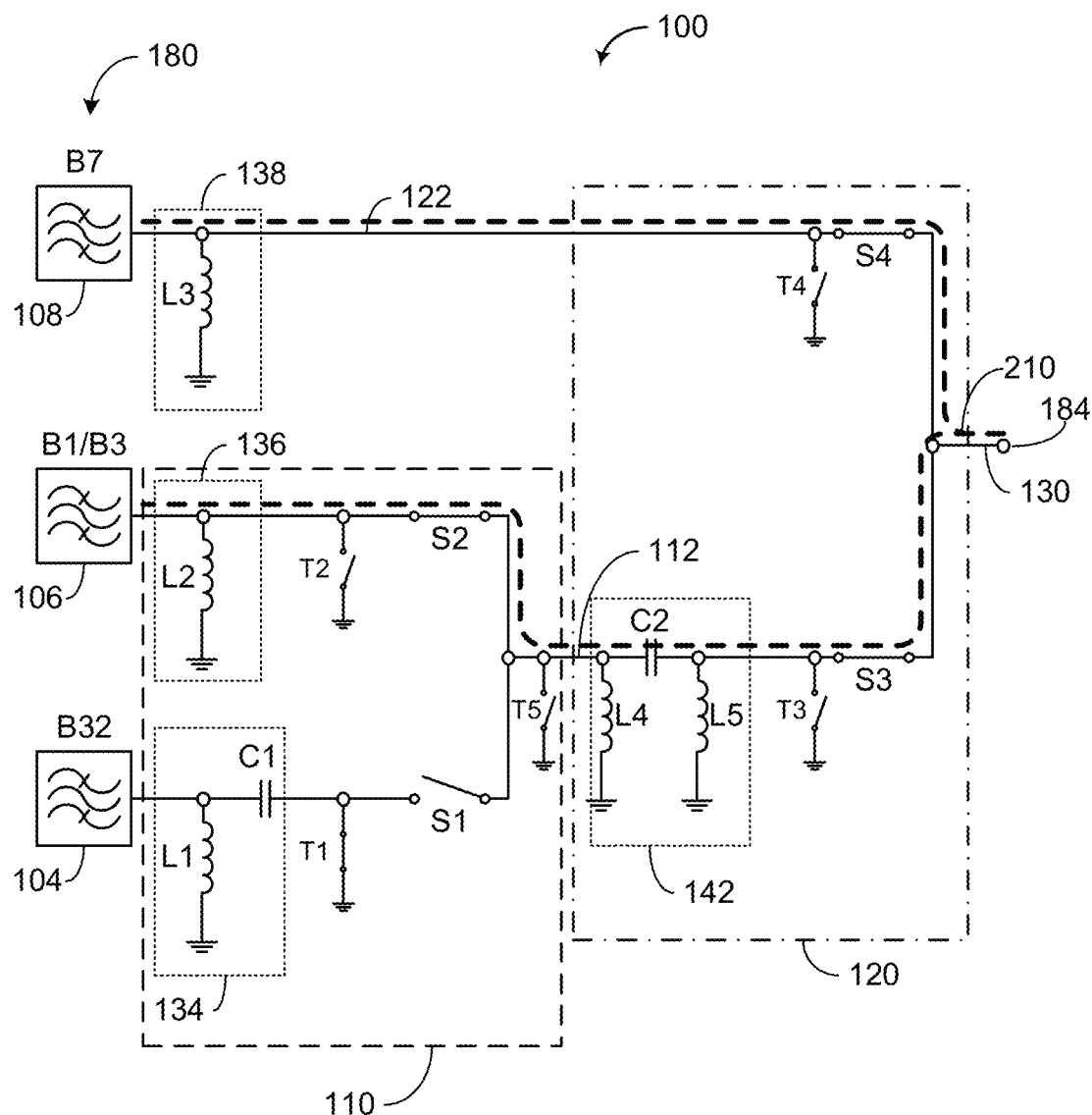
FIG. 12F shows an example of a two-band carrier aggregation operation involving the B1/B3 band and the B7 band.
Figure 12G:
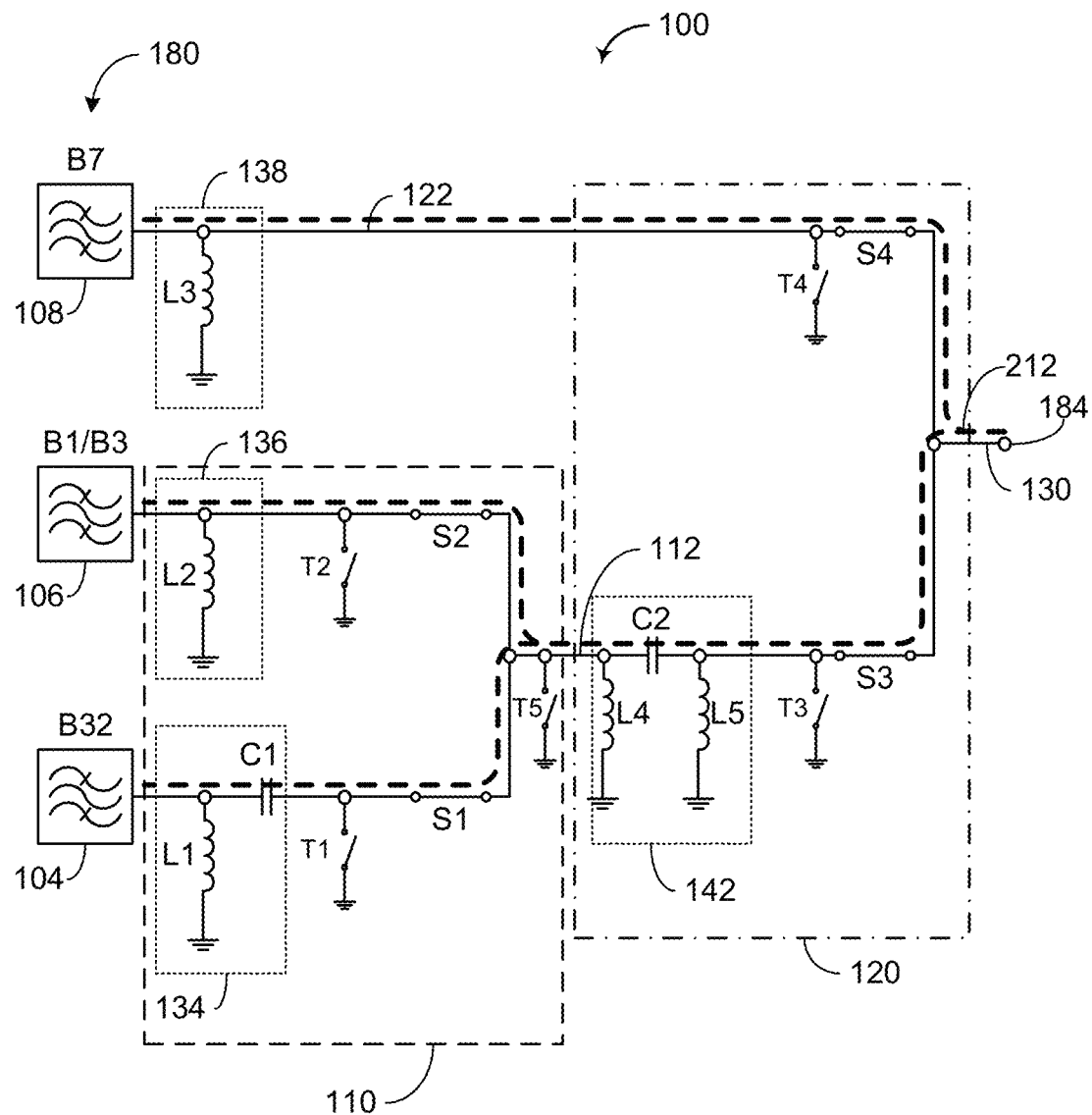
FIG. 12G shows an example of a three-band carrier aggregation operation involving the B32 band, the B1/B3 band and the B7 band.

FIGS. 12A-12G show various non-carrier aggregation and carrier aggregation operations that can be implemented with the example staged combining circuit 100 of FIG. 11. FIGS. 12A-12C show non-carrier aggregation operations that can be implemented for the three example bands B32, B1/B3, B7 utilizing the staged combining circuit 100. FIGS. 12D-12F show two-band carrier aggregation operations that can be implemented for different combinations of the three example bands B32, B1/B3, B7 utilizing the staged combining circuit 100. FIG. 12G shows a three-band carrier aggregation operation that can be implemented for the three example bands B32, B1/B3, B7 utilizing the staged combining circuit 100.

FIG. 12A shows an example of a non-carrier aggregation operation involving the B32 band (an MLB band). To achieve such an operation, switches S1 and S3 can be closed, and the corresponding shunt switches T1, T5, T3 can be opened, so as to provide a signal path 200 between the B32 filter and the output node 184. The other series switches (S2, S4) can be opened, and the corresponding shunt switches (T2, T4) can be closed.

FIG. 12B shows an example of a non-carrier aggregation operation involving the B1/B3 band (an MB band). To achieve such an operation, switches S2 and S3 can be closed, and the corresponding shunt switches T2, T5, T3 can be opened, so as to provide a signal path 202 between the B1/B3 filter and the output node 184. The other series switches (S1, S4) can be opened, and the corresponding shunt switches (T1, T4) can be closed.

FIG. 12C shows an example of a non-carrier aggregation operation involving the B7 band (a HB band). To achieve such an operation, switch S4 can be closed, and the corresponding shunt switch T4 can be opened, so as to provide a signal path 204 between the B7 filter and the output node 184. The other series switches (S1, S2, S3) can be opened, and the corresponding shunt switches (T1, T2, T3) can be closed.

FIG. 12D shows an example of a two-band carrier aggregation operation involving the B32 band (an MLB band) and the B1/B3 band (an MB band). To achieve such an operation, switches S1, S2 and S3 can be closed, and the corresponding shunt switches T1, T2, T5, T3 can be opened, so as to provide an aggregated signal path 206 from the B32 filter and the B1/B3 filter. The other series switch(es) (S4) can be opened, and the corresponding shunt switch(es) (T4) can be closed.

FIG. 12E shows an example of a two-band carrier aggregation operation involving the B32 band (an MLB band) and the B7 band (a HB band). To achieve such an operation, switches S1, S3 and S4 can be closed, and the corresponding shunt switches T1, T5, T3, T4 can be opened, so as to provide an aggregated signal path 208 from the B32 filter and the B7 filter. The other series switch(es) (S2) can be opened, and the corresponding shunt switch(es) (T2) can be closed.

FIG. 12F shows an example of a two-band carrier aggregation operation involving the B1/B3 band (an MB band) and the B7 band (a HB band). To achieve such an operation, switches S2, S3 and S4 can be closed, and the corresponding shunt switches T2, T5, T3, T4 can be opened, so as to provide an aggregated signal path 210 from the B1/B3 filter and the B7 filter. The other series switch(es) (S1) can be opened, and the corresponding shunt switch(es) (T1) can be closed.

FIG. 12G shows an example of a three-band carrier aggregation operation involving the B32 band (an MLB band), the B1/B3 band (an MB band) and the B7 band (a HB band). To achieve such an operation, switches S1, S2, S3 and S4 can be closed, and the corresponding shunt switches T1, T2, T5, T3, T4 can be opened, so as to provide an aggregated signal path 212 from the B32 filter, the B1/B3 filter and the B7 filter.

In the examples of FIGS. 11 and 12, the filter indicated as 106 is depicted as a single filter for the purpose of describing the various operations with the staged combining circuit 100. In some embodiments, such a filter (106) can be a single filter configured to support both of B1 and B3 bands, or be an assembly of B1 and B3 filters (as depicted in FIG. 10). If in the latter configuration, and assuming that the assembly is in a ganged configuration, such a configuration can be considered to be a combining stage.

Figure 13:
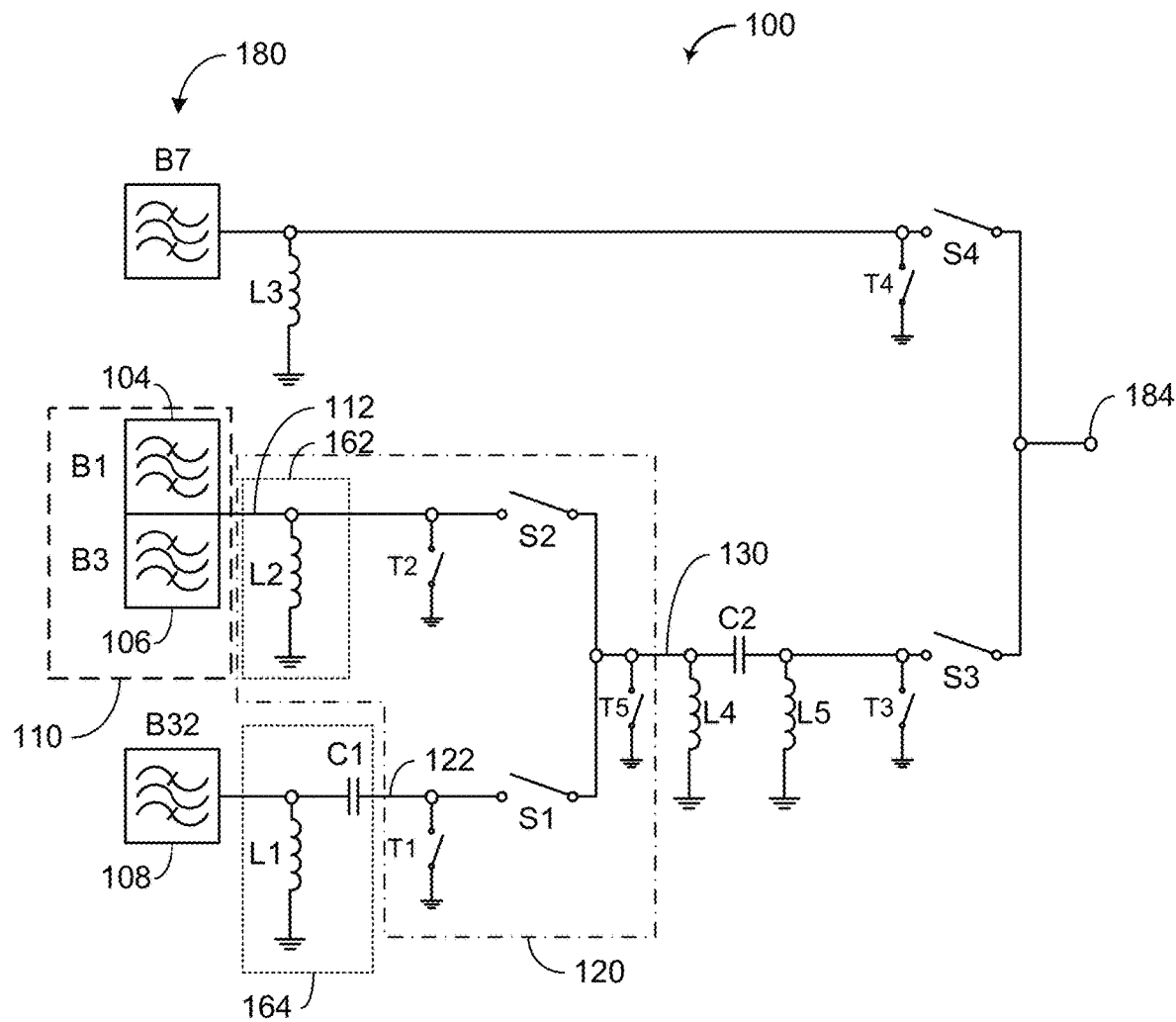
FIG. 13 shows the front-end of FIG. 11, but with different designations of first and second combining stages.

For example, FIG. 13 shows the front-end of FIG. 11, but with different designations of first and second combining stages. In FIG. 13, the ganged assembly of B1 and B3 filters 104, 106 can be considered to form a first combining stage 110, similar to the example of FIG. 8. Accordingly, a second combining stage 120 can combine the aggregated signal (in combined signal path 112) with a signal from the B32 filter 108. Such a second combining stage (120) can include the phase shifting circuit 162 (136 in FIGS. 11 and 12) and the switches S1 and S2.

In view of the examples of FIGS. 11-13, one can see that a staged combining circuit 100 having one or more features as described herein can include more than two combining stages. For example, the B1+B3 combining example of FIG. 13 can be considered to be a first combining stage to provide an aggregated B1/B3 signal. Then, the B1/B3+B32 combining example of FIG. 13 (a second combining stage in FIG. 13) and FIG. 11 (a first combining stage in FIG. 11) can be considered to be a second combining stage to provide an aggregated B1/B3/B32 signal. Then, the B1/B3/B32+B7 combining example of FIG. 11 can be considered to be a third combining stage to provide an aggregated B1/B3/B32/B7 signal.

Figure 14:
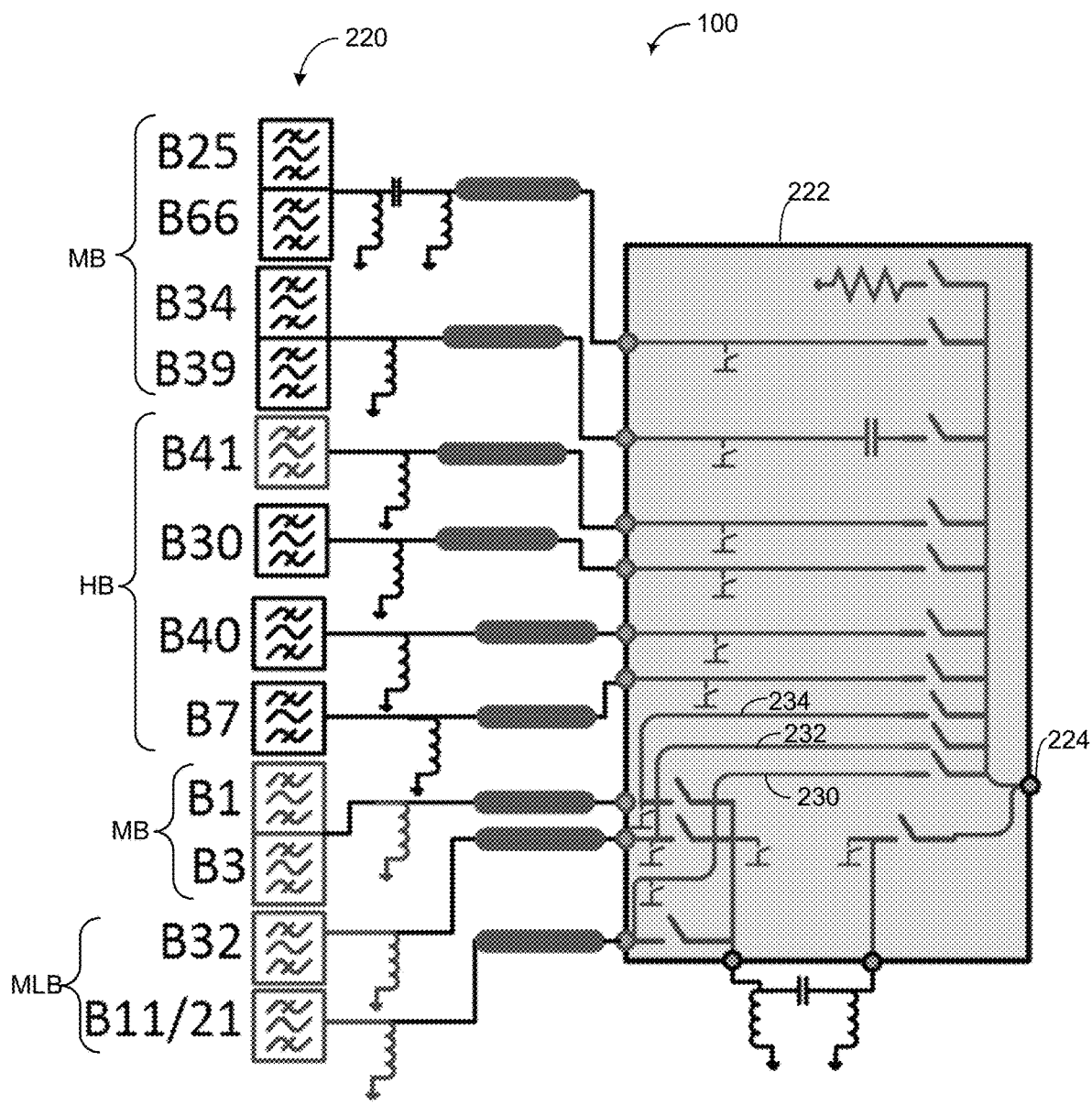
FIG. 14 shows another example front-end architecture with a staged combining circuit having one or more features as described herein.

FIG. 14 shows another example front-end architecture with a staged combining circuit 100 having one or more features as described herein. The staged combining circuit 100 of FIG. 14 is similar to the staged combining circuit 100 of FIG. 9, except that in the staged combining circuit 100 of FIG. 14, example bypass paths 230, 232, 234 are provided for MLB and MB bands B11/21, B32, B1/B3, respectively.

Figure 15:
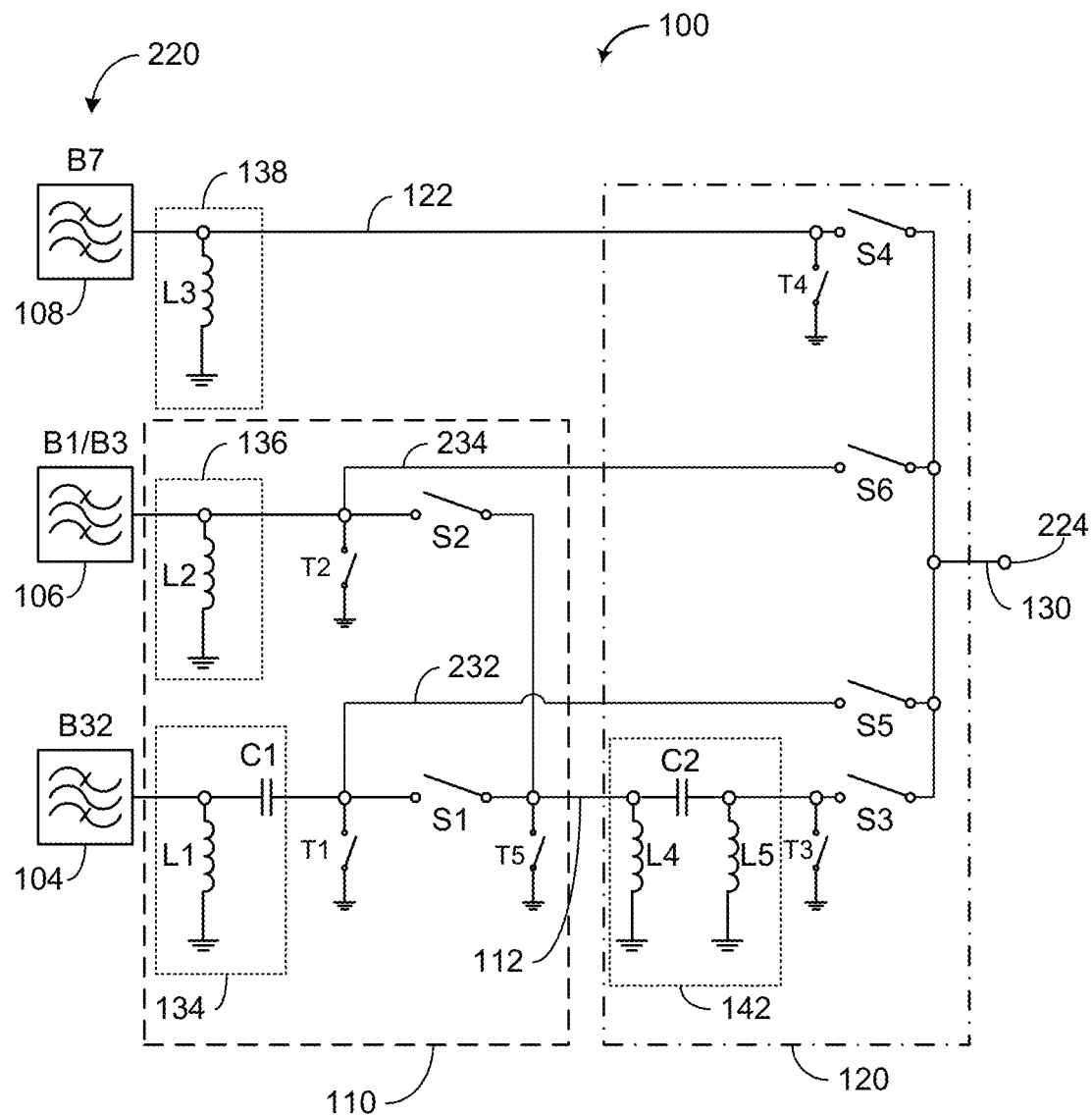
FIG. 15 shows an isolated view of the example front-end of FIG. 14, similar to FIG. 11 showing an isolated view of the example front-end of FIG. 10.

FIG. 15 shows an isolated view of the example front-end of FIG. 14, similar to FIG. 11 showing an isolated view of the example front-end of FIG. 10. In the isolated view of FIG. 15, bypass paths 232, 234 for the B32 filter and the B1/B3 filter are shown. In some embodiments, each of such bypass paths (232, 234) can be implemented by coupling a node of the respective shunt switch (T1 or T2) to the output node 224 through a respective switch (S5 or S6).

Configured in the foregoing manner, a non-carrier aggregation operation involving a band with a respective bypass path can be achieved with performance that is better than a similar non-carrier aggregation operation without a bypass path. For example, FIGS. 16A and 16B show examples of non-carrier aggregation operations involving respective bypass paths.

Figure 16A:
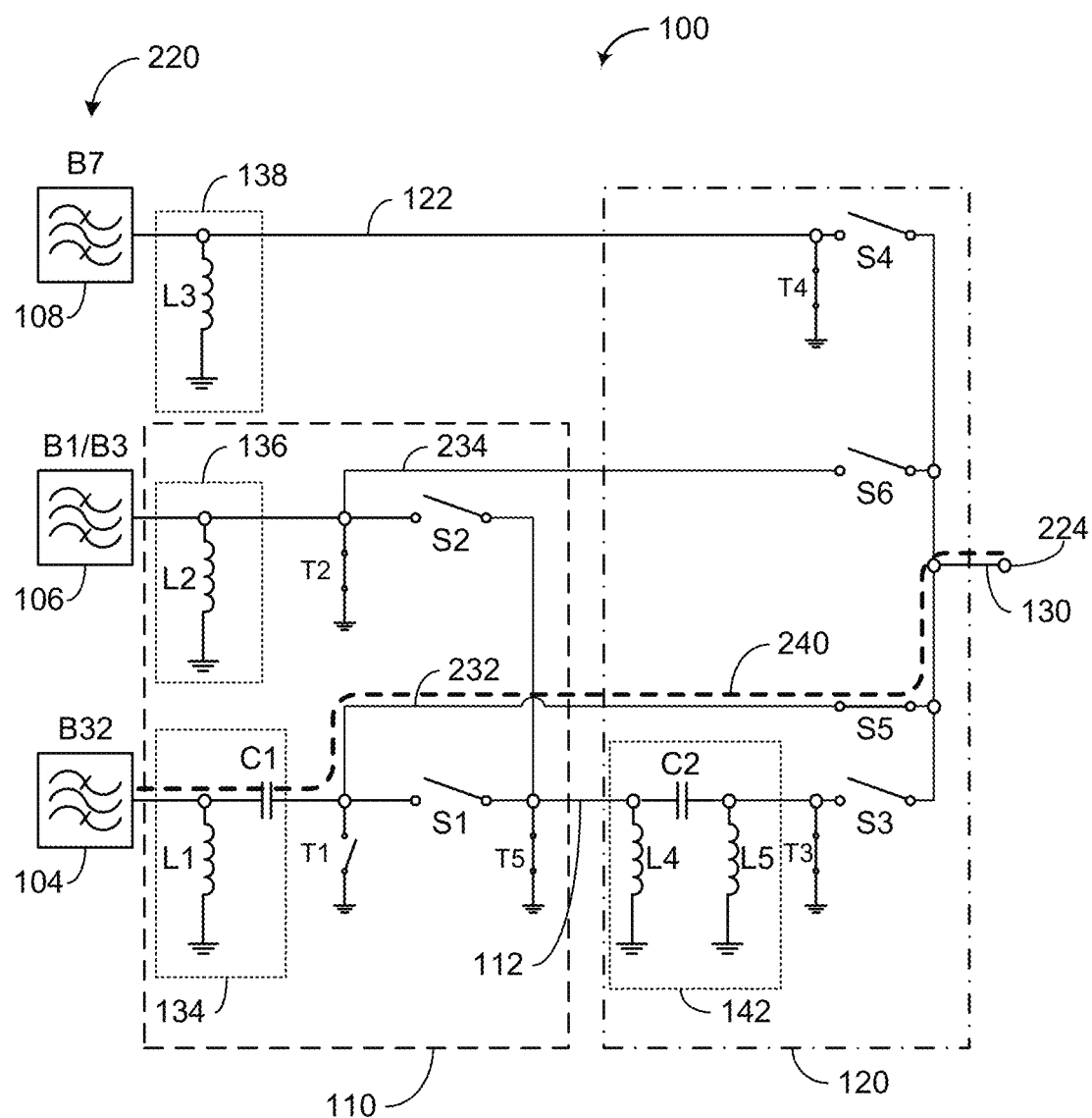
FIG. 16A shows an example of a non-carrier aggregation operation involving an example MLB band B32.

FIG. 16A shows an example of a non-carrier aggregation operation involving the B32 band (an MLB band). To achieve such an operation, switch S5 can be closed to provide a signal path 240 that includes the bypass path 232. In such an operation, switches S1 and S3 (both of which are closed in the example of FIG. 12A) can be open. Other series and shunt switches can be configured as shown and described herein to achieve the foregoing non-carrier aggregation operation involving the B32 band.

Figure 16B:
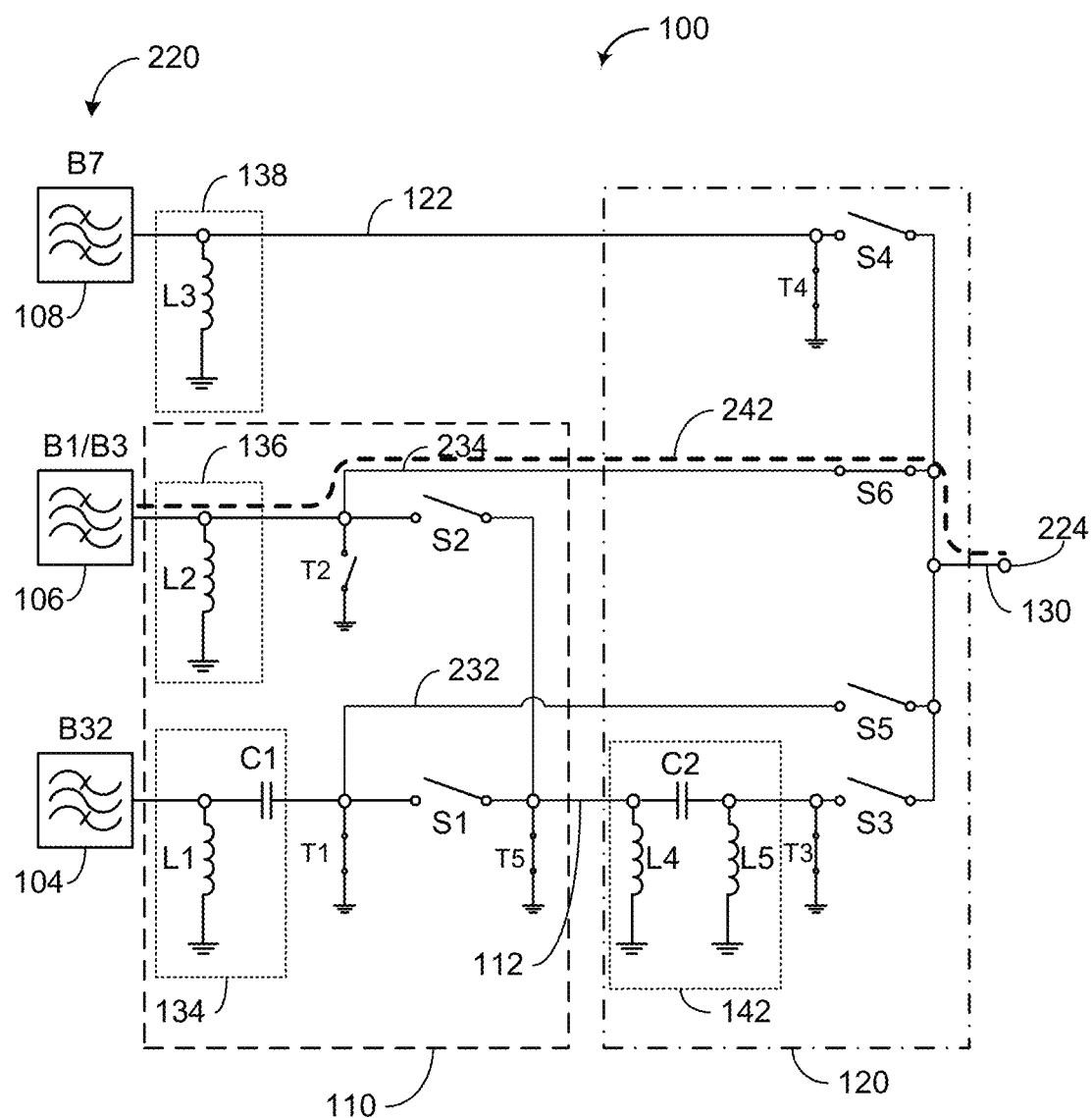
FIG. 16B shows an example of a non-carrier aggregation operation involving an example MB band B1/B3.

Similarly, FIG. 16B shows an example of a non-carrier aggregation operation involving the B1/B3 band (an MB band). To achieve such an operation, switch S6 can be closed to provide a signal path 242 that includes the bypass path 234. In such an operation, switches S2 and S3 (both of which are closed in the example of FIG. 12B) can be open. Other series and shunt switches can be configured as shown and described herein to achieve the foregoing non-carrier aggregation operation involving the B1/B3 band.

Figure 17:
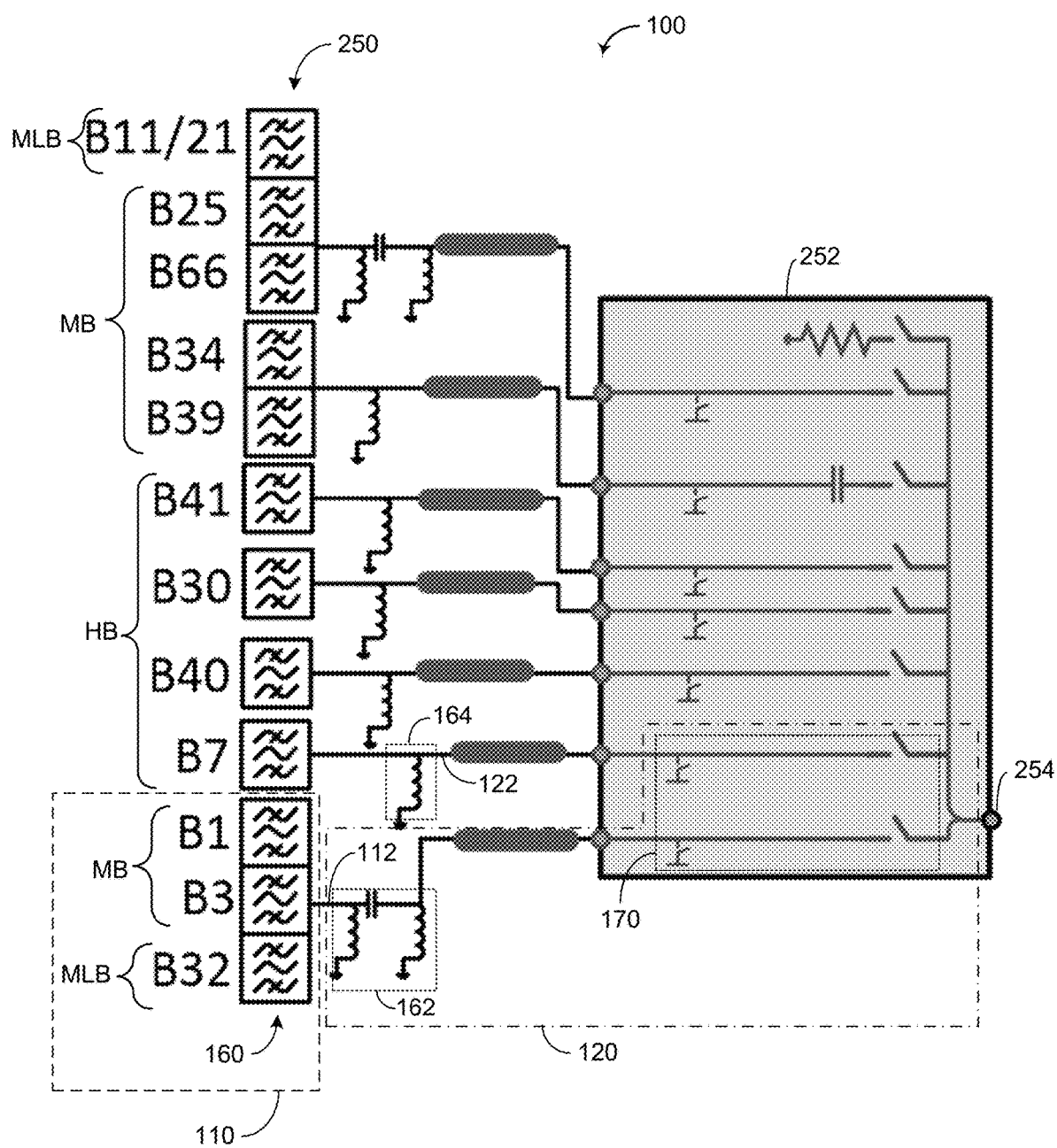
FIG. 17 shows yet another example front-end architecture with a staged combining circuit having one or more features as described herein.

FIG. 17 shows yet another example front-end architecture with a staged combining circuit 100 having one or more features as described herein. The staged combining circuit 100 of FIG. 17 includes a ganged assembly of a plurality of filters that provide a combining stage.

More particularly, the staged combining circuit 100 of FIG. 17 can include a ganged assembly (160) of a B32 filter (MLB), a B3 filter (MB), and a B1 filter (MB). Such a ganged assembly can be configured to provide carrier aggregation functionality for various combinations of B32, B3 and B1 bands. Thus, the ganged assembly 160 can be considered to be a first combining stage 110.

It is noted that in some embodiments the first combining stage 110 having the ganged assembly 160 can be implemented without separate phase shifting circuits (e.g., 134 and 136 in the examples of FIGS. 11 and 15). It is also noted that switches associated with the first combining stage 100 in FIGS. 11 and 15 can be eliminated with the use of the ganged assembly 160 for the first combining stage 110.

In the example of FIG. 17, a second combining stage 120 can be configured to combine the aggregated signal (at the combined path 112) with a filtered signal (at signal path 122) from the B7 filter (HB), similar to the examples of FIGS. 10 and 14. Accordingly, the example second combining stage 120 can include a phase shifting circuit 162 and a switch circuit 170, so as to provide an aggregated signal at an output node 254 of a switch network 252.

Figure 18:
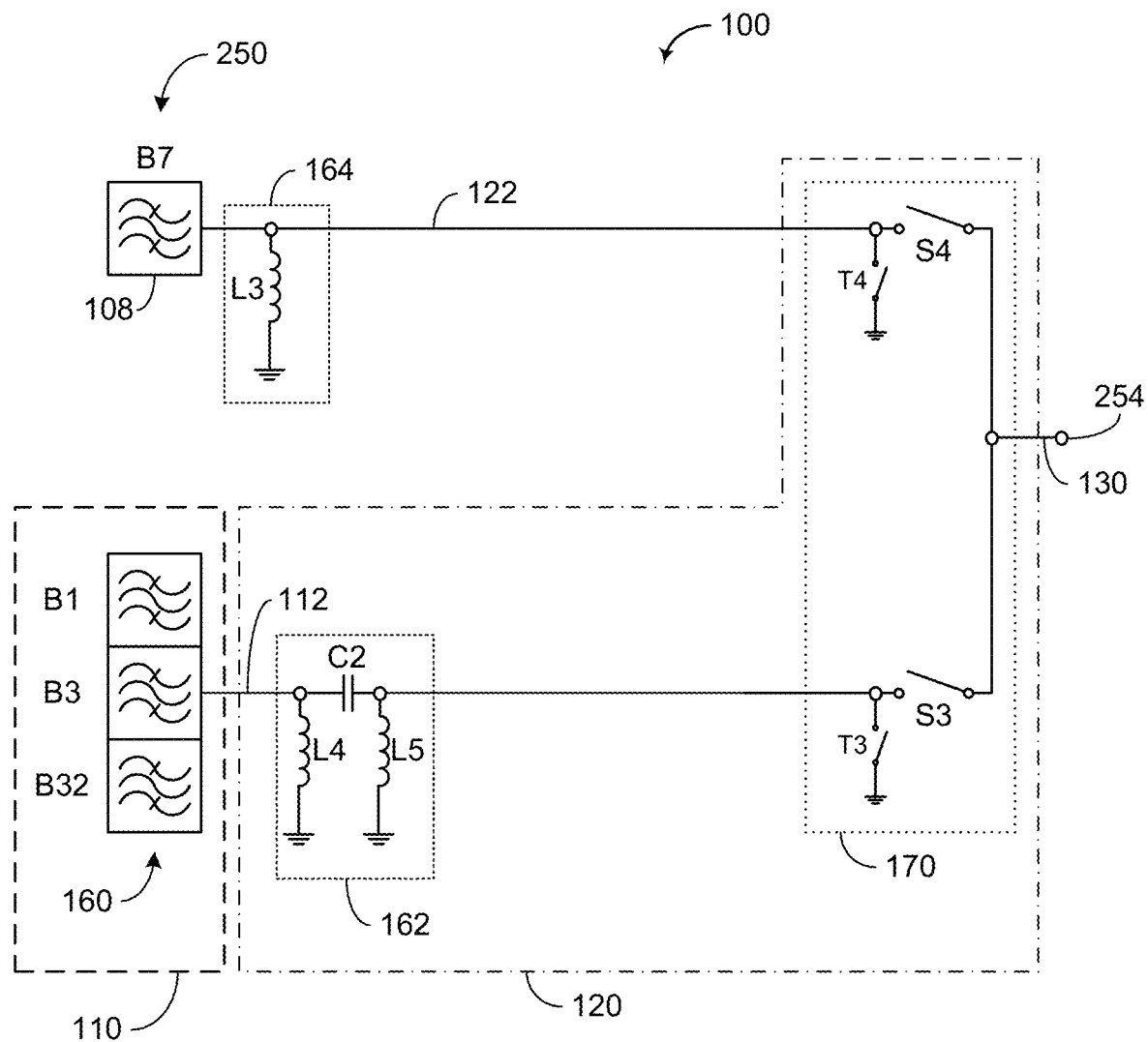
FIG. 18 shows an isolated view of the example front-end of FIG. 17, similar to FIG. 11 showing an isolated view of the example front-end of FIG. 10.

FIG. 18 shows an isolated view of the example front-end of FIG. 17, similar to FIG. 11 showing an isolated view of the example front-end of FIG. 10. In the isolated view of FIG. 18, operation of the second combining stage 120 can be achieved similar to the example of FIG. 11.

Figure 19:
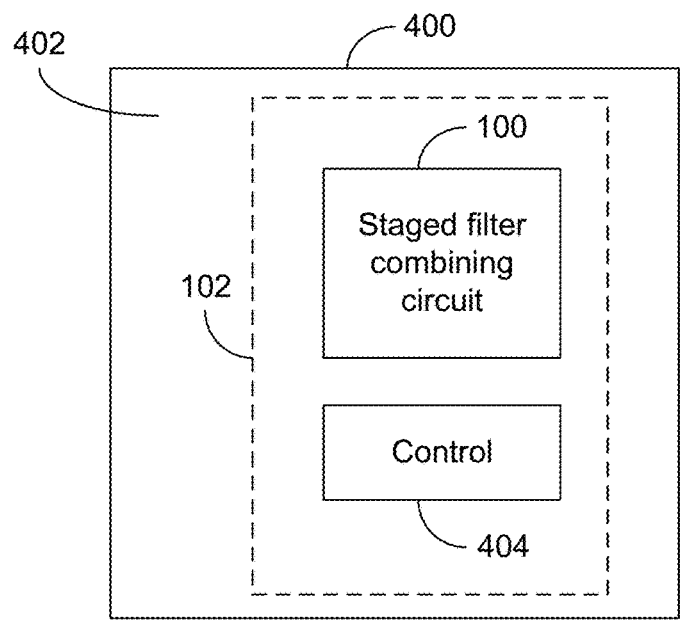
FIG. 19 shows that in some embodiments, one or more features of the present disclosure can be implemented in a packaged module.

FIG. 19 shows that in some embodiments, one or more features of the present disclosure can be implemented in a packaged module 400. Such a module can include a packaging substrate 402 configured to receive a plurality of components. Some or all of such components can be implemented to provide a front-end architecture 102 having a staged combining circuit 100 as described herein. In some embodiments, at least some of the functionalities (e.g., switching functionality) can be controlled by a control component 404.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 20:
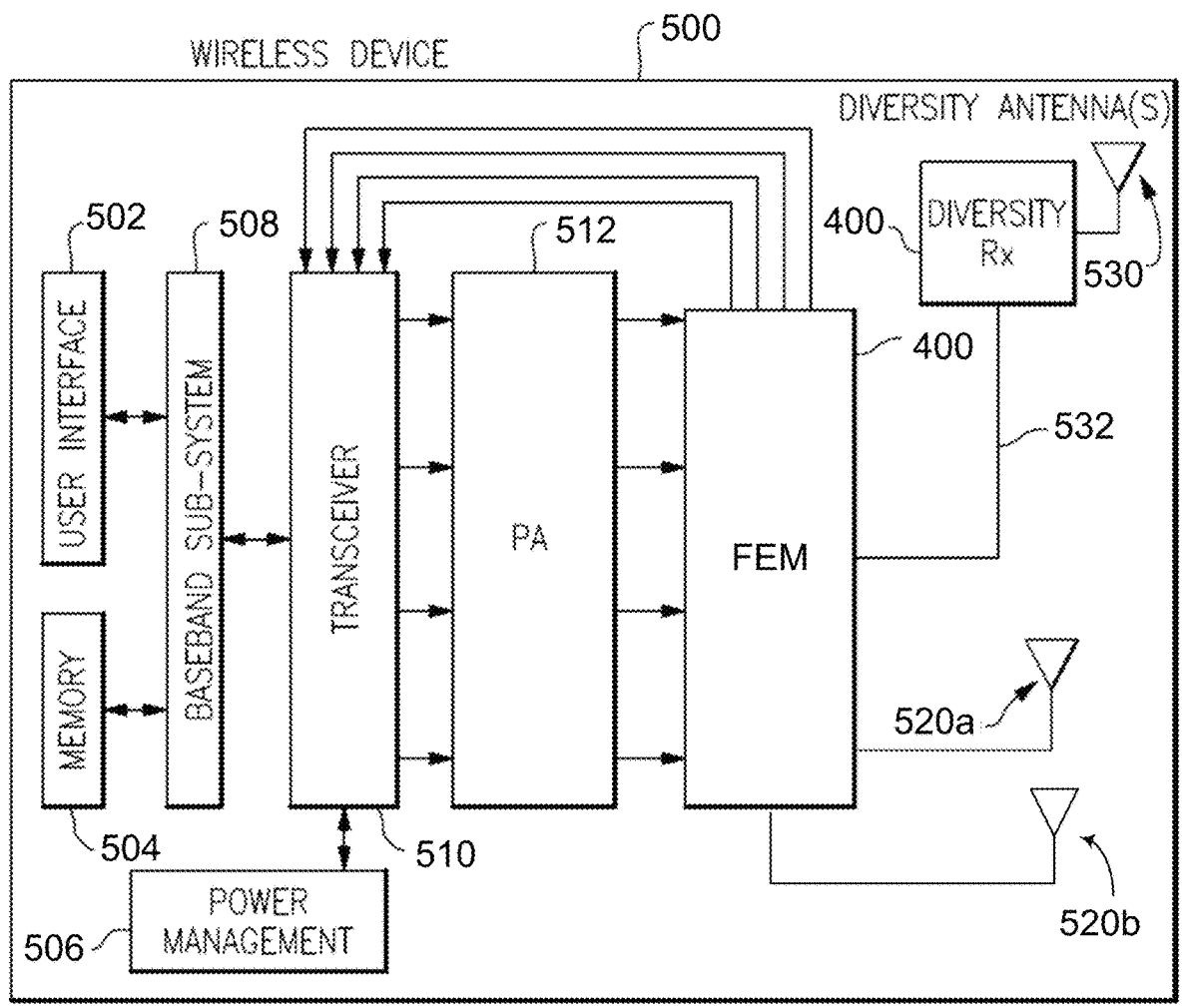
FIG. 20 schematically depicts an example wireless device having one or more advantageous features described herein.

FIG. 20 schematically depicts an example wireless device 500 having one or more advantageous features described herein. In some embodiments, such advantageous features can be implemented in, for example, a front-end module (FEM) 400 and/or in a diversity receive (Rx) module 400 as described herein.

In the example of FIG. 20, power amplifiers (Pas) in a PA module 512 can receive their respective RF signals from a transceiver 510 that can be configured and operated to generate RF signals to be amplified and transmitted, and to process received signals. The transceiver 510 is shown to interact with a baseband sub-system 508 that is configured to provide conversion between data and/or voice signals suitable for a user and RF signals suitable for the transceiver 510. The transceiver 510 is also shown to be connected to a power management component 506 that is configured to manage power for the operation of the wireless device 500. Such power management can also control operations of the baseband sub-system 508 and other components of the wireless device 500.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In the example wireless device 500, the front-end module 400 can include one or more carrier aggregation-capable signal paths configured to provide one or more functionalities as described herein. Such signal paths can be in communication with an antenna switch module (ASM) through their respective diplexer(s). In some embodiments, at least some of the signals received through a diversity antenna 530 can be routed from the ASM to one or more low-noise amplifiers (LNAs). Amplified signals from the LNAs can be routed to the transceiver 510.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

One or more features of the present disclosure can be implemented with various cellular frequency bands as described herein. Examples of such bands are listed in Table 1. It will be understood that at least some of the bands can be divided into sub-bands. It will also be understood that one or more features of the present disclosure can be implemented with frequency ranges that do not have designations such as the examples of Table 1.

TABLE 1

| Band | Tx Frequency Range (MHz) | Rx Frequency Range (MHz) |
|---|---|---|
| B1 | 1,920-1,980 | 2,110-2,170 |
| B2 | 1,850-1,910 | 1,930-1,990 |
| B3 | 1,710-1,785 | 1,805-1,880 |
| B4 | 1,710-1,755 | 2,110-2,155 |
| B5 | 824-849 | 869-894 |
| B6 | 830-840 | 875-885 |
| B7 | 2,500-2,570 | 2,620-2,690 |
| B8 | 880-915 | 925-960 |
| B9 | 1,749.9-1,784.9 | 1,844.9-1,879.9 |
| B10 | 1,710-1,770 | 2,110-2,170 |
| B11 | 1,427.9-1,447.9 | 1,475.9-1,495.9 |
| B12 | 699-716 | 729-746 |
| B13 | 777-787 | 746-756 |
| B14 | 788-798 | 758-768 |
| B15 | 1,900-1,920 | 2,600-2,620 |
| B16 | 2,010-2,025 | 2,585-2,600 |
| B17 | 704-716 | 734-746 |
| B18 | 815-830 | 860-875 |
| B19 | 830-845 | 875-890 |
| B20 | 832-862 | 791-821 |
| B21 | 1,447.9-1,462.9 | 1,495.9-1,510.9 |
| B22 | 3,410-3,490 | 3,510-3,590 |
| B23 | 2,000-2,020 | 2,180-2,200 |
| B24 | 1,626.5-1,660.5 | 1,525-1,559 |
| B25 | 1,850-1,915 | 1,930-1,995 |
| B26 | 814-849 | 859-894 |
| B27 | 807-824 | 852-869 |
| B28 | 703-748 | 758-803 |
| B29 | N/A | 716-728 |
| B30 | 2,305-2,315 | 2,350-2,360 |
| B31 | 452.5-457.5 | 462.5-467.5 |
| B32 | | 1,452-1,496 |
| B33 | 1,900-1,920 | 1,900-1,920 |
| B34 | 2,010-2,025 | 2,010-2,025 |
| B35 | 1,850-1,910 | 1,850-1,910 |
| B36 | 1,930-1,990 | 1,930-1,990 |
| B37 | 1,910-1,930 | 1,910-1,930 |
| B38 | 2,570-2,620 | 2,570-2,620 |
| B39 | 1,880-1,920 | 1,880-1,920 |
| B40 | 2,300-2,400 | 2,300-2,400 |
| B41 | 2,496-2,690 | 2,496-2,690 |
| B42 | 3,400-3,600 | 3,400-3,600 |
| B43 | 3,600-3,800 | 3,600-3,800 |
| B44 | 703-803 | 703-803 |
| B66 | 1,710-1,780 | 2,110-2,200 |

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A carrier aggregation circuit comprising:
a first combining stage configured to aggregate a first received signal in a first path associated with a first band and a second received signal in a second path associated with a second band to provide a first aggregated signal in a first combined path; and
a second combining stage configured to aggregate the first aggregated signal in the first combined path and a third received signal in a third path associated with a third band to provide a second aggregated signal in a second combined path, the first combined path including a phase shifting circuit tuned to include the third band, the third path including a phase shifting circuit tuned to include the first and second bands.

2. The carrier aggregation circuit of claim 1 wherein the first path is configured to receive the first received signal from a first filter, the second path is configured to receive the second received signal from a second filter, and the third path is configured to receive the third received signal from a third filter.

3. The carrier aggregation circuit of claim 2 wherein each of the first and second paths of the first combining stage includes a phase shifting circuit.

4. The carrier aggregation circuit of claim 1 wherein the first combining stage includes a switch circuit configured to connect or disconnect each of the first and second paths to the first combined path.

5. The carrier aggregation circuit of claim 4 wherein the second combining stage includes a switch circuit configured to connect or disconnect each of the first combined path and the third path to the second combined path.

6. The carrier aggregation circuit of claim 5 wherein the switch circuit of the first combining stage and the switch circuit of the second combining stage are configured to support a carrier aggregation operation or a non-carrier aggregation operation.

7. The carrier aggregation circuit of claim 1 wherein the first path is configured to provide the first received signal to a first filter, and the second path is configured to provide the second received signal to a second filter, the first and second filters arranged in a ganged configuration having the first combined path as an output.

8. The carrier aggregation circuit of claim 7 wherein the first and second filters are parts of the first combining stage.

9. The carrier aggregation circuit of claim 7 wherein the third path is configured to receive the third received signal from a third filter.

10. The carrier aggregation circuit of claim 7 wherein the second combining stage includes a switch circuit configured to connect or disconnect each of the first combined path and the third path to the second combined path.

11. The carrier aggregation circuit of claim 10 wherein the switch circuit of the second combining stage is configured to support a carrier aggregation operation or a non-carrier aggregation operation.

12. The carrier aggregation circuit of claim 1 further comprising a switchable bypass path implemented for at least one of the first, second and third paths, each bypass path configured to support a non-carrier aggregation operation involving the respective band.

13. The carrier aggregation circuit of claim 1 further comprising a third combining stage configured to aggregate the second aggregated signal in the second combined path and a fourth received signal in a fourth path associated with a fourth band to provide a third aggregated signal in a third combined path.

14. A radio-frequency module comprising:
a packaging substrate configured to receive a plurality of components; and
a carrier aggregation circuit implemented on the packaging substrate, the carrier aggregation circuit including a first combining stage configured to aggregate a first received signal in a first path associated with a first band and a second received signal in a second path associated with a second band to provide a first aggregated signal in a first combined path, the carrier aggregation circuit further including a second combining stage configured to aggregate the first aggregated signal in the first combined path and a third received signal in a third path associated with a third band to provide a second aggregated signal in a second combined path, the third band, the third path including a phase shifting circuit tuned to include the first and second bands.

15. A radio-frequency device comprising:

an antenna; and a front-end architecture in communication with the antenna and including a carrier aggregation circuit that includes a first combining stage configured to aggregate a first received signal in a first path associated with a first band and a second received signal in a second path associated with a second band to provide a first aggregated signal in a first combined path, the carrier aggregation circuit further including a second combining stage configured to aggregate the first aggregated signal in the first combined path and a third received signal in a third path associated with a third band to provide a second aggregated signal in a second combined path, the first combined path including a phase shifting circuit tuned to include the third band, the third path including a phase shifting circuit tuned to include the first and second bands.

* * * * *